(12) United States Patent
Yashima et al.

(10) Patent No.: US 12,001,339 B2
(45) Date of Patent: Jun. 4, 2024

(54) DICTIONARY COMPRESSION DEVICE AND MEMORY SYSTEM

(71) Applicant: Kioxia Corporation, Tokyo (JP)

(72) Inventors: Daisuke Yashima, Tachikawa Tokyo (JP); Sho Kodama, Kawasaki Kanagawa (JP); Keiri Nakanishi, Kawasaki Kanagawa (JP); Masato Sumiyoshi, Yokohama Kanagawa (JP); Youhei Fukazawa, Kawasaki Kanagawa (JP); Zheye Wang, Chuo Tokyo (JP); Kohei Oikawa, Kawasaki Kanagawa (JP); Takashi Miura, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 85 days.

(21) Appl. No.: 17/940,138

(22) Filed: Sep. 8, 2022

(65) Prior Publication Data

US 2023/0289293 A1  Sep. 14, 2023

(30) Foreign Application Priority Data

Mar. 9, 2022 (JP) .................................. 2022-036126

(51) Int. Cl.
*G06F 12/00* (2006.01)
*G06F 12/0875* (2016.01)
*H03M 7/30* (2006.01)

(52) U.S. Cl.
CPC .. *G06F 12/0875* (2013.01); *G06F 2212/1044* (2013.01); *G06F 2212/401* (2013.01)

(58) Field of Classification Search
CPC .. G06F 12/04; G06F 12/0246; G06F 12/0875; G06F 3/0608; G06F 3/0661; G06F 3/0679; G06F 2212/1044; G06F 2212/401; H03M 7/3084; H03M 7/3086; H03M 7/3088; H03M 7/6058
USPC .............. 341/51; 707/693; 708/203; 710/68; 711/3, 154; 715/242
See application file for complete search history.

(56) References Cited

U.S. PATENT DOCUMENTS

| 6,392,567 B2 | 5/2002 | Satoh |
| 8,704,686 B1 | 4/2014 | Agarwal et al. |
| 10,637,498 B1 | 4/2020 | Li et al. |

(Continued)

FOREIGN PATENT DOCUMENTS

| JP | H9-232967 A | 9/1997 |
| JP | 4261779 B2 | 4/2009 |

(Continued)

*Primary Examiner* — Ilwoo Park
(74) *Attorney, Agent, or Firm* — Maier & Maier, PLLC

(57) ABSTRACT

According to one embodiment, a dictionary buffer stores dictionary data including a first substring and data before the first substring. A substring generator generates, from second input data, second substrings. A transformer transforms each of the second substrings into a hash value. A read processor reads the dictionary data, using a hash value transformed from a third substring among the second substrings. An acquisition unit compares a data string including the third substring and data before the third substring with the read dictionary data, and acquire first and second match lengths of the third and fourth substrings. A coded data generator generates coded data based on the acquired first and second match lengths.

17 Claims, 9 Drawing Sheets

(56) References Cited

U.S. PATENT DOCUMENTS

| | | | |
|---|---|---|---|
| 2019/0065494 A1* | 2/2019 | Abali | ................ G06F 12/0246 |
| 2020/0186165 A1* | 6/2020 | Chang | ................ H03M 7/3088 |
| 2021/0294500 A1 | 9/2021 | Kodama et al. | |
| 2022/0255556 A1 | 8/2022 | Yashima et al. | |
| 2023/0060654 A1* | 3/2023 | Fouladi Fard | ...... G06F 16/9014 |

FOREIGN PATENT DOCUMENTS

| | | |
|---|---|---|
| JP | 2021-149416 A | 9/2021 |
| JP | 2022-121983 A | 8/2022 |
| KR | 101705461 B1 * | 2/2017 |

* cited by examiner

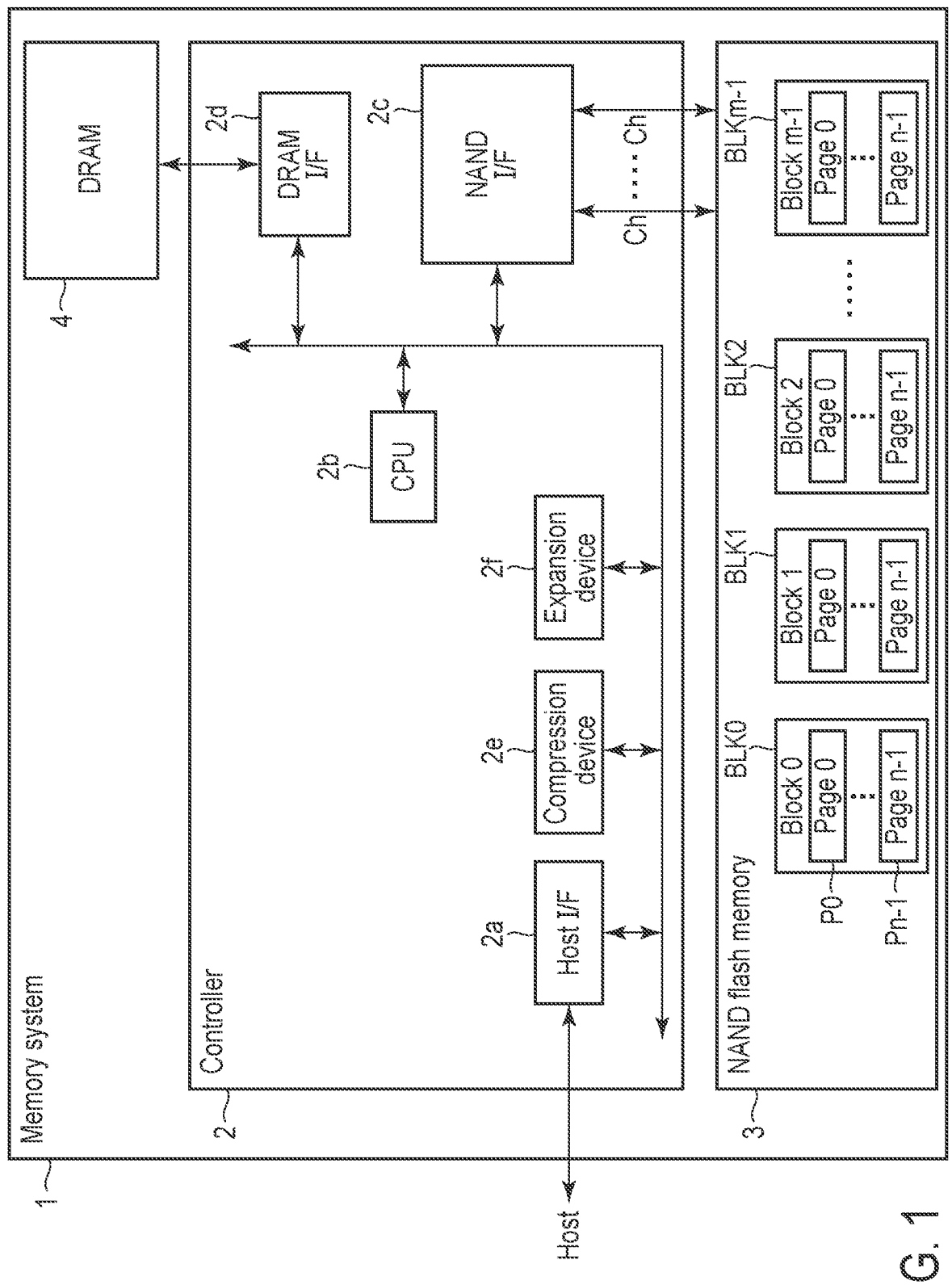
F I G. 1

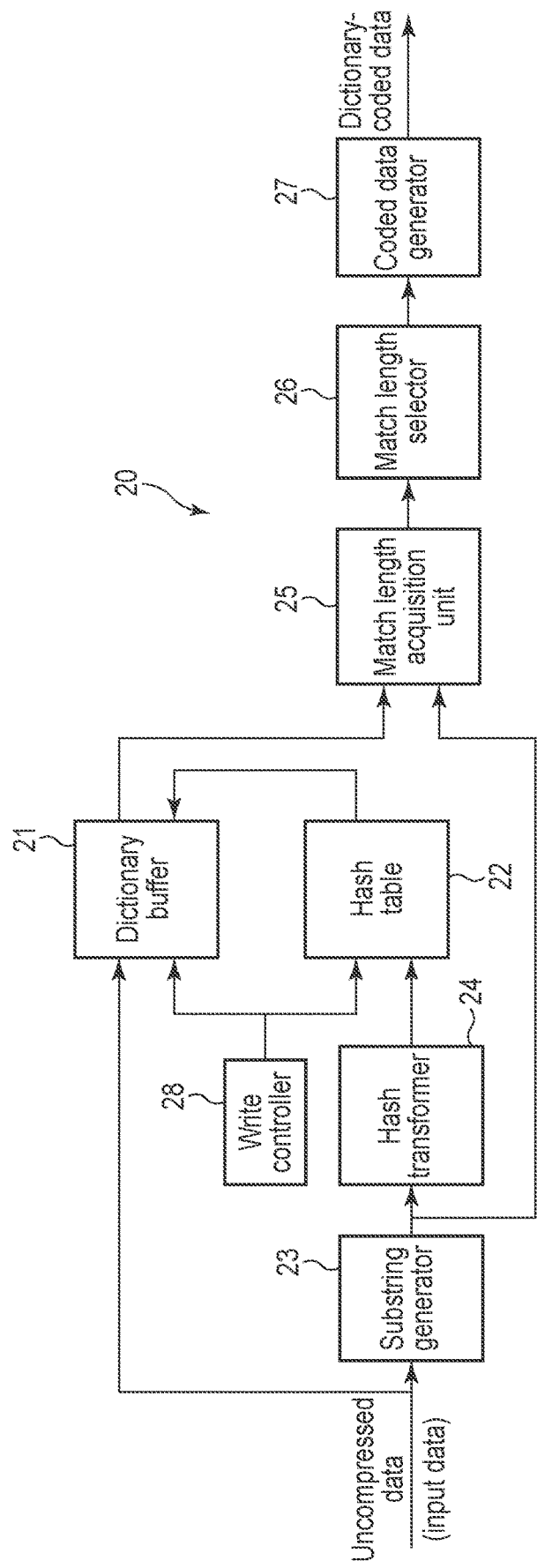
F I G. 9

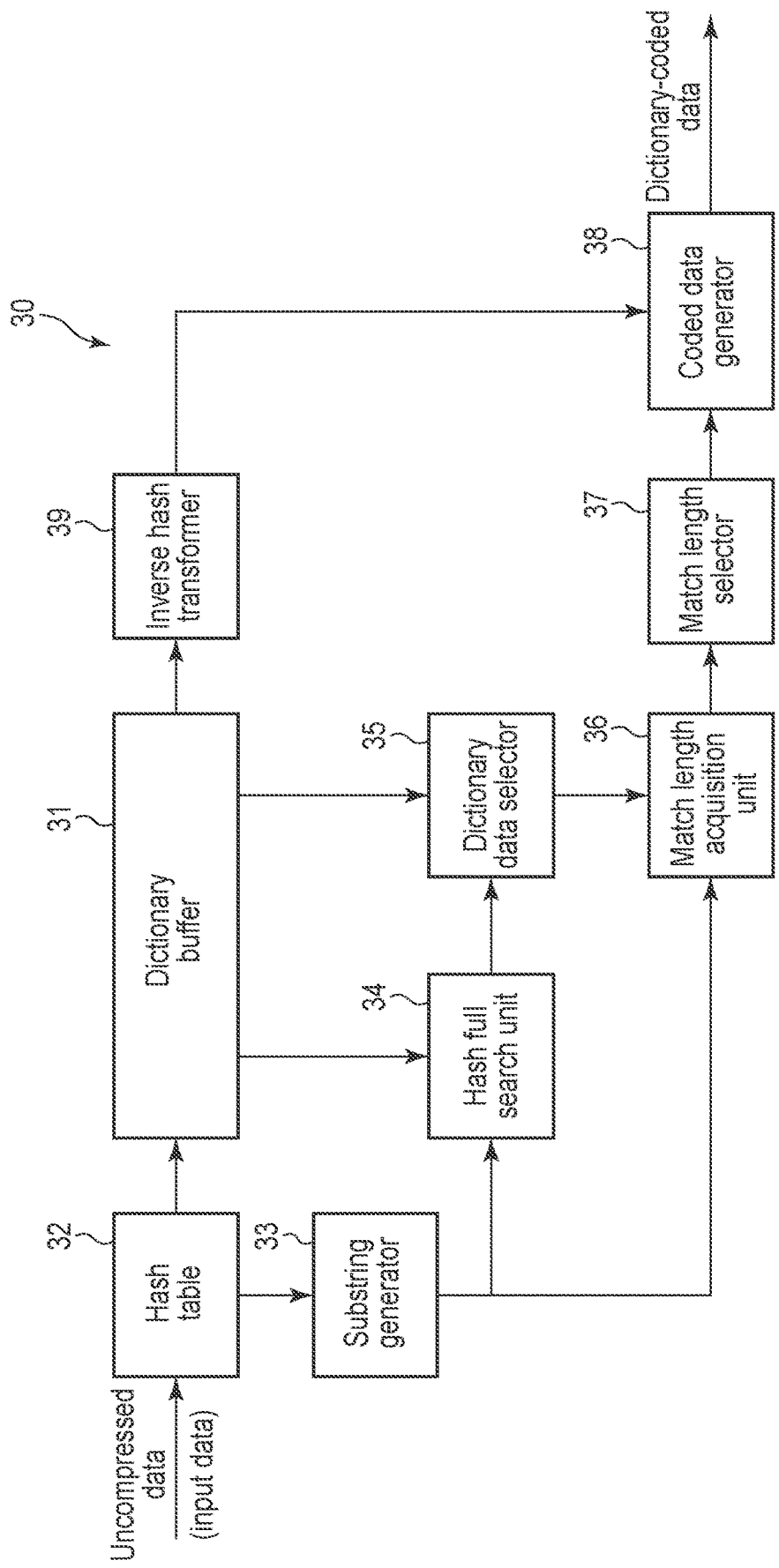
F I G. 11

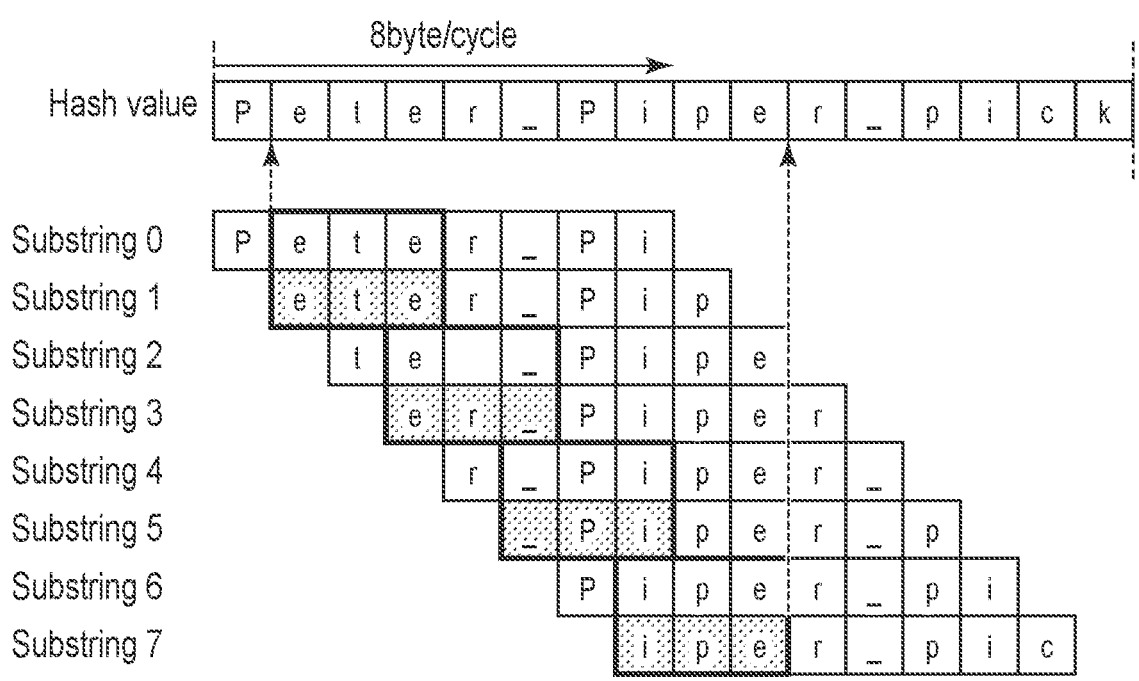
F I G. 12

DICTIONARY COMPRESSION DEVICE AND MEMORY SYSTEM

CROSS-REFERENCE TO RELATED APPLICATIONS

This application is based upon and claims the benefit of priority from Japanese Patent Application No. 2022-036126, filed Mar. 9, 2022, the entire contents of which are incorporated herein by reference.

FIELD

Embodiments described herein relate generally to a dictionary compression device and a memory system.

BACKGROUND

In order to effectively utilize a storage area, a memory system having a function of compressing data is known. In such a memory system, in the case in which a write command is issued from a host connected to the memory system, data designated in the write command can be compressed and written in a nonvolatile memory. Note that compressing data means reducing the data volume by transforming the data into a code allocated to the data (i.e., by encoding the data).

Here, as a coding method used for compressing data, dictionary coding using a dictionary buffer in which past data (data history) is stored for a certain period is known. In the dictionary coding, a part of uncompressed data is used as input data, and past data that matches (at least a part of) the input data is searched from the dictionary buffer. In the case in which past data matching the input data exists in the dictionary buffer, match information including a pair of a matching length (hereinafter, referred to as a match length) of the input data and the past data and a position (hereinafter, referred to as an offset) of the past data on the uncompressed data is output. According to the dictionary coding, it is possible to reduce the data volume by replacing the input data with the match information.

Note that in recent years, the data volume handled in a memory system has increased, and dictionary coding (compression) with a high throughput is requested.

BRIEF DESCRIPTION OF THE DRAWINGS

FIG. 1 is a block diagram schematically illustrating an example of a hardware configuration of a memory system according to a first embodiment.

FIG. 9 is a block diagram illustrating an example of a configuration of a dictionary compression device according to a second embodiment.

FIG. 11 is a block diagram illustrating an example of a configuration of a dictionary compression device according to the third embodiment.

FIG. 12 is a diagram that describes search target data in the third embodiment.

DETAILED DESCRIPTION

Figure 2:
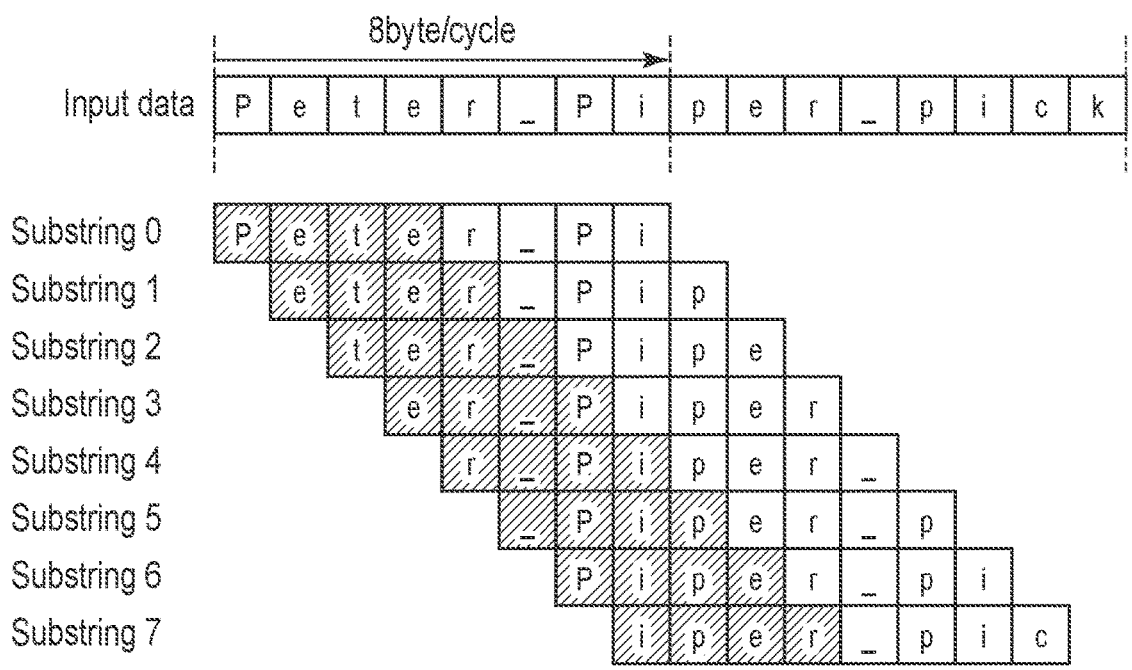
FIG. 2 is a diagram that specifically describes a plurality of substrings generated from input data in a comparative example to the first embodiment.

In general, according to one embodiment, a dictionary compression device is configured to compress uncompressed data including first input data and second input data by performing dictionary coding on the second input data subsequent to the first input data after performing dictionary coding on the first input data including a plurality of pieces of consecutive data. The dictionary compression device includes a dictionary buffer, a substring generator, a transformer, a read processor, an acquisition unit, and a coded data generator. The dictionary buffer includes a plurality of storage areas and is configured to store dictionary data in a dictionary address of a storage area of the plurality of storage areas. Each of the plurality of storage areas corresponds to each of a plurality of first substrings. Each of the plurality of first substrings includes consecutive data. Each of the plurality of first substrings includes each of a plurality of pieces of data included in the first input data as a head. The dictionary data includes a first substring and data before the first substring included in the first input data. The storage area corresponds to the first substring. The dictionary address corresponds to a hash value transformed from the first substrings. The substring generator is configured to generate, from the second input data, a plurality of second substrings. Each of the plurality of second substrings includes consecutive data. Each of the plurality of second substrings includes each of a plurality of pieces of data included in the second input data as a head. The transformer is configured to transform each of the second substrings into a hash value. The read processor is configured to read the dictionary data from a plurality of storage areas included in the dictionary buffer, using a hash value transformed from a third substring among the second substrings as a dictionary address. The acquisition unit is configured to compare a data string including the third substring and data before the third substring included in the second input data with the read dictionary data, and acquire at least one first match length indicating a match length between the third substring and the read dictionary data and at least one second match length indicating a match length between a fourth substring including consecutive data having data before data at a head of the third substring as a head and the read dictionary data. The coded data generator is configured to generate coded data for the second input data based on the acquired first and second match lengths. Dictionary data including the second substring and data before the second substring included in the second input data is written in a storage area corresponding to the second substring, with a hash value that is transformed from the second substring as a dictionary address.

Hereinafter, embodiments will be described with reference to the drawings.

First Embodiment

First, a first embodiment will be described. FIG. 1 is a block diagram schematically illustrating an example of a hardware configuration of a memory system according to the first embodiment.

A memory system 1 illustrated in FIG. 1 is a semiconductor storage device configured to write data (user data) to a nonvolatile memory and read data from the nonvolatile memory. The memory system 1 can be implemented as, for example, a solid state drive (SSD).

The memory system 1 is formed connectable to a host through a system bus such as a PCI Express bus. As illustrated in FIG. 1, the memory system 1 includes a controller 2, a NAND flash memory 3, and a dynamic random access memory (DRAM) 4.

The controller 2 has a function of controlling the operation of the memory system 1. The controller 2 includes a host interface (I/F) 2a, a central processing unit (CPU) 2b, a NAND interface (I/F) 2c, a DRAM interface (I/F) 2d, and the like. Note that the host interface 2a, the CPU 2b, the NAND interface 2c, and the DRAM interface 2d are connected to each other through, for example, a bus.

The host interface 2a is a host interface circuit configured to execute communication with a host disposed in the outside of the memory system 1. The host interface 2a may be, for example, a PCI Express controller or the like. The host interface 2a receives various commands (requests) from the host.

The CPU 2b is a processor configured to control the host interface 2a, the NAND interface 2c, the DRAM interface 2d, and the like. In response to power-on of the memory system 1, the CPU 2b loads a control program (firmware) from the NAND flash memory 3 or a read only memory (ROM) (not illustrated) into the DRAM 4, and executes the control program to perform various processes. Specifically, the CPU 2b executes processing for various commands issued from the host. Note that part or all of the processing for the command issued from the host may be executed by dedicated hardware in the controller 2.

The NAND interface 2c is a memory control circuit configured to control the NAND flash memory 3 under the control of the CPU 2b.

The controller 2 further includes a compression device (compressor) 2e and a decompression device (decompressor) 2f.

For example, in the case in which a write command is issued from the host, a compression device 2e inputs data (uncompressed data) designated in the write command, and compresses the data by transforming the input data into a code (i.e., by encoding the data). The compression device 2e compresses data using, for example, a coding method (compression method) in which dictionary coding and entropy coding are combined.

The data (hereinafter, referred to as compressed data) compressed by the compression device 2e is output from the compression device 2e, and then, the compressed data is subjected to predetermined processing such as error correction processing and randomization processing. The CPU 2b writes, to the NAND flash memory 3 through the NAND interface 2c, data obtained by subjecting the compressed data to predetermined processing. That is, the CPU 2b writes data based on the compressed data output from the compression device 2e to the NAND flash memory 3.

For example, in the case in which a read command is received from the host through the host interface 2a, the CPU 2b reads data based on the read command from the NAND flash memory 3 through the NAND interface 2c. The read data is input to an expansion device 2f by the CPU 2b as compressed data after subjected to predetermined processing such as error correction processing and randomization release processing. The expansion device 2f decompresses the input compressed data. That is, the expansion device 2f decompresses the compressed data based on the data read from the NAND flash memory 3.

The NAND flash memory 3 is a nonvolatile memory and has a memory cell array including a plurality of memory cells disposed in a matrix. The NAND flash memory 3 may be a NAND flash memory having a two-dimensional structure or a NAND flash memory having a three-dimensional structure.

The memory cell array of the NAND flash memory 3 includes a plurality of blocks BLK0 to BLKm−1. The blocks BLK0 to BLKm−1 are configured of a large number of pages (here, pages P0 to Pn−1). The blocks BLK0 to BLKm−1 function as erase units. The pages P0 to Pn−1 each include a plurality of memory cells connected to the same word line. The pages P0 to Pn−1 are units of a data write operation and a data read operation.

Here, the description is made that the memory system 1 includes the NAND flash memory 3. However, the memory system 1 may include, for example, a phase change memory (PCM) or a magnetoresistive random access memory (MRAM) as a nonvolatile memory.

The DRAM 4 is a volatile memory, and functions as, for example, a temporary buffer of software executed in the controller 2 (CPU 2b) or a temporary buffer for the NAND flash memory 3.

Note that although FIG. 1 illustrates that the memory system 1 includes the NAND flash memory 3 and the DRAM 4, it is assumed that the memory system 1 further includes a volatile memory (not illustrated) such as a static random access memory (SRAM) in the inside of the controller 2, for example.

In addition, in FIG. 1, the description is made that the compression device 2e and the expansion device 2f are built in the controller 2. However, one or both of the compression device 2e and the expansion device 2f may be provided in the outside of the memory system 1 or the controller 2.

Here, as described above, in the compression device 2e according to the present embodiment, the uncompressed data is compressed by the coding method combining the dictionary coding with the entropy coding, and the compression device 2e includes a dictionary compression device (dictionary coder) that performs the dictionary coding on the uncompressed data, and an entropy compression device (entropy coder) that performs the entropy coding on the result of the dictionary coding performed by the dictionary compression device.

Note that the entropy coding performed by the entropy compression device is a coding method in which codes in different code lengths are allocated to data using a difference in the appearance frequency of the data input to the entropy compression device to reduce the data volume as a whole (i.e., data is compressed), and is performed as the subsequent stage of the dictionary coding performed by the dictionary compression device.

On the other hand, the dictionary coding performed by the dictionary compression device is a coding technique in which data (a part of uncompressed data) input to the dictionary compression device is transformed into (replaced with) a relative reference of data input as a target of dictionary coding before the data.

Hereinafter, the outline of the dictionary coding in a comparative example to the present embodiment will be described. In the dictionary coding, a part of uncompressed data is used as input data, and past input data at least partially matching with the input data is searched from a dictionary buffer (dictionary memory) in which input data (i.e., past input data) before the input data is stored, and thus the input data is transformed into a relative reference of the past input data. In the comparative example to the present embodiment, a configuration that implements a high throughput in the dictionary coding by executing a search process on such a dictionary buffer in parallel will be described.

Note that in the dictionary coding, for example, processing on uncompressed data is sequentially executed according to a processing unit referred to as a cycle. Here, for example, it is assumed that eight-byte data is processed in one cycle. In this case, in the comparative example to the present embodiment, data of 16 bytes for two cycles of the uncompressed data is used as input data, and a plurality of substrings is generated (formed) from the input data.

Here, a plurality of substrings generated from input data will be specifically described with reference to FIG. 2.

In the example illustrated in FIG. 2, it is assumed that the input data is "Peter_Piper_pick" (i.e., 16 byte data) in which 16 pieces of data (hereinafter, referred to as character data) representing one character by one byte continue. In other words, the input data is character string data including 16 pieces of continuous character data.

In this case, a plurality of substrings is generated, including continuous character data having each piece of character data included in the input data as a head. Note that the substrings are data (here, data having the same length as data processed in one cycle) having a length equivalent to a throughput, and is generated while shifting the character data at the head of the substring one by one. In addition, here, the number of substrings corresponding to the throughput is generated (here, the number of substrings is the same as the number of pieces of character data processed in one cycle).

Specifically, assuming that eight-byte data is processed in one cycle as described above, as illustrated in FIG. 2, eight substrings of a substring 0 "Peter_Pi", a substring 1 "eter_Pip", a substring 2 "ter_Pipe", a substring 3 "er_Piper", a substring 4 "r_Piper_", a substring 5 "_Piper_p", a substring 6 "Piper_pi", and a substring 7 "iper_pic" are generated from the input data "Peter_Piper_pick".

In the comparative example to the present embodiment, data at least partially matching the substrings generated as illustrated in FIG. 2 are searched in parallel from the dictionary buffer (i.e., the search for the length equivalent to the throughput is performed in parallel).

Specifically, from the dictionary buffer, data in which a predetermined number of pieces of character data match is searched from the head character data of the substrings. Note that since the substrings are generated by shifting the character data that is the head of the substring one by one among the pieces of character data included in the input data, it is not necessary to search for matching data from the character data present in the middle of the substrings.

Here, the dictionary buffer stores a substring (i.e., the past substring) generated from the past input data as the past input data, and the past substring is stored in an address (hereinafter, referred to as a dictionary address) of the dictionary buffer represented by a hash value transformed from the past substring. That is, a hash value transformed from a past substring is allocated as a dictionary address to (the storage area of) the dictionary buffer, and the dictionary buffer is configured to be accessible using the hash value.

Note that the hash value used as the dictionary address is obtained by performing hash transform on data having a length of the shortest match length from the head of the substring. Note that the shortest match length is predetermined in order to implement efficient search and compression (coding) in the dictionary coding. In the case in which eight-byte data (i.e., data of eight characters) is processed in one cycle as described above, the shortest match length can be set to, for example, four.

Note that the hatched part of the substrings illustrated in FIG. 2 indicates data (data having the length of the shortest match length from the head) targeted for hash transform when the substring is transformed into a hash value.

According to this, by reading the past substring stored in the address represented by the hash value transformed from the substring generated from the input data from the dictionary buffer, it is possible to search for data (past substring) in which the substring matches at least the data having the shortest match length.

Note that although description is made here that the data of four characters from the head included in the substring is transformed into the hash value (i.e., the shortest match length is four), the shortest match length may be determined according to, for example, throughput or the like, and may be another value.

In the case in which the search process on the dictionary buffer is executed as described above, and data in which at least the data having the shortest match length from the head included in the substring matches is read from the dictionary buffer, the dictionary-coded data for the input data (data resulting from performing the dictionary coding on the input data) is generated based on the match length indicating the match length between the substring and the data read from the dictionary buffer.

Note that as described above, while the substrings generated from the input data are searched from the dictionary buffer, the substrings are added to the dictionary buffer for dictionary coding on subsequent input data.

Specifically, the hash value transformed from the substrings is used as the dictionary address, and the substring and a pointer indicating the position of the substring on the uncompressed data are written to the dictionary address.

That is, although the description is made assuming that the past input data (past substring) is stored in the dictionary buffer, specifically, the past substring is stored in the dictionary buffer together with the pointer indicating the position of the past substring on the uncompressed data. In the dictionary coding, by reading the past substring and the pointer from such a dictionary buffer, it is possible to generate the dictionary-coded data in which the input data is replaced with the match information including the pair of the match length and the offset based on the pointer (the relative position of the past substring on the uncompressed data).

Hereinafter, the outline of a configuration of the dictionary buffer used in the dictionary coding will be described with reference to FIG. 3. The dictionary buffer is implemented by, for example, an SRAM or the like, and has the number of memory banks (logical constituent units of the memory) the same as the number of substrings generated from one piece of input data.

Figure 3:
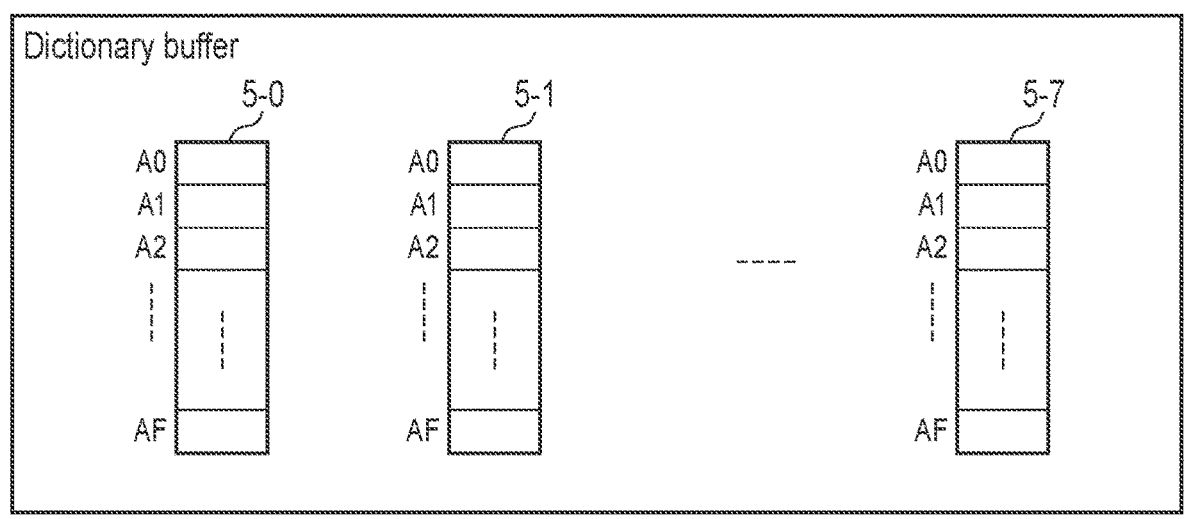
FIG. 3 is a diagram that describes the outline of a configuration of a dictionary buffer in a comparative example to the first embodiment.

In the case in which eight substrings are generated from the input data as described above, the dictionary buffer has eight (i.e., the number corresponding to the throughput) memory banks 5-0 to 5-7 as illustrated in FIG. 3.

In this case, the substrings (and the pointers) are written to the memory bank corresponding to the substring. Specifically, for example, when the dictionary address represented by the hash value transformed from the substring 0 is A0, the substring 0 is written to the dictionary address A0 of the memory bank 5-0 corresponding to the substring 0. Although the substring 0 is described here, the same applies to the other substrings 1 to 7.

Since the substring is stored in the dictionary address represented by the hash value transformed from the substring as described above, it is assumed that the shared dictionary address (e.g., A0 to AF, and the like) is allocated to the memory banks 5-0 to 5-7 as illustrated in FIG. 3.

Here, in the comparative example to the present embodiment, a past substring that matches the substrings generated from input data is searched from the dictionary buffer in parallel (i.e., the search process is executed on the dictionary buffer in parallel), and thus it is possible to implement a high throughput.

However, since each of the past substrings is written in the corresponding one memory bank as described above, in the search process on the dictionary buffer, it is necessary to read data from all of the memory banks included in the dictionary buffer using (the dictionary address represented by) the hash value transformed from the substring for the substrings.

That is, in the dictionary coding in the comparative example to the present embodiment, it is necessary to read the same number of pieces of data as the number of the substrings generated from the input data for one memory bank at every cycle, and it is necessary to read the number of substrings×the number of memory banks (i.e., a square of the number of substrings) as the entire dictionary buffer. In this case, a scale of a circuit that reads data from the dictionary buffer (a circuit for dictionary reading) becomes very large.

Therefore, the dictionary compression device according to the present embodiment has a configuration that reduces the scale of a circuit that achieves a high throughput in the dictionary coding (a configuration that suppresses the circuit scale to be small) as compared with the above-described comparative example.

Figure 4:
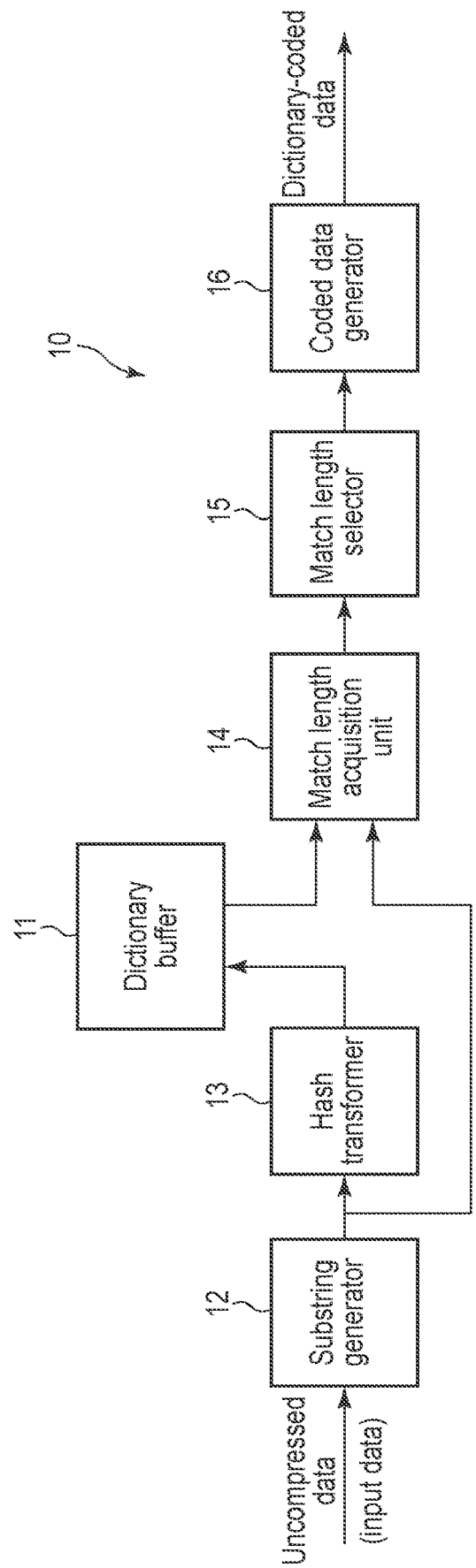
FIG. 4 is a block diagram illustrating an example of a configuration of a dictionary compression device according to the first embodiment.

Hereinafter, the dictionary compression device according to the present embodiment will be described in detail. FIG. 4 is a block diagram illustrating an example of a configuration of the dictionary compression device according to the present embodiment.

As illustrated in FIG. 4, a dictionary compression device 10 includes a dictionary buffer 11, a substring generator 12, a hash transformer 13, a match length acquisition unit 14, a match length selector 15, and a coded data generator 16.

In the present embodiment, the dictionary compression device 10 is configured to compress uncompressed data by dictionary coding. In this case, the uncompressed data includes, for example, a plurality of pieces of consecutive data, and the dictionary compression device 10 uses a part of the uncompressed data as input data and sequentially performs the dictionary coding on the input data.

Note that in the present embodiment, although the pieces of data included in the uncompressed data is assumed to be, for example, character data or the like in which one character is represented by one byte, the pieces of data may be other pieces of data. In addition, assuming that eight-byte data is processed in one cycle in the dictionary coding, for example, the input data described above is 16 byte data (i.e., data for two cycles) of the uncompressed data.

Here, a description will be given assuming that dictionary coding is performed on predetermined input data (past input data) of the uncompressed data, and then dictionary coding is performed on input data (hereinafter, referred to as target input data) after the past input data.

The dictionary buffer 11 is configured of a memory such as an SRAM, for example, and has the number of memory banks (storage areas) the same as the number of substrings generated from one piece of input data (e.g., 16 byte data) as described above with reference to FIG. 3.

In the present embodiment, (the memory bank included in) the dictionary buffer 11 stores, using a hash value transformed from a past substring as a dictionary address, a data string (hereinafter, referred to as dictionary data) including the past substring and data immediately before the past substring included in the past input data. Note that the past substring is a data string including consecutive data with each of a plurality of pieces of data included in the past input data as a head.

Figure 5:
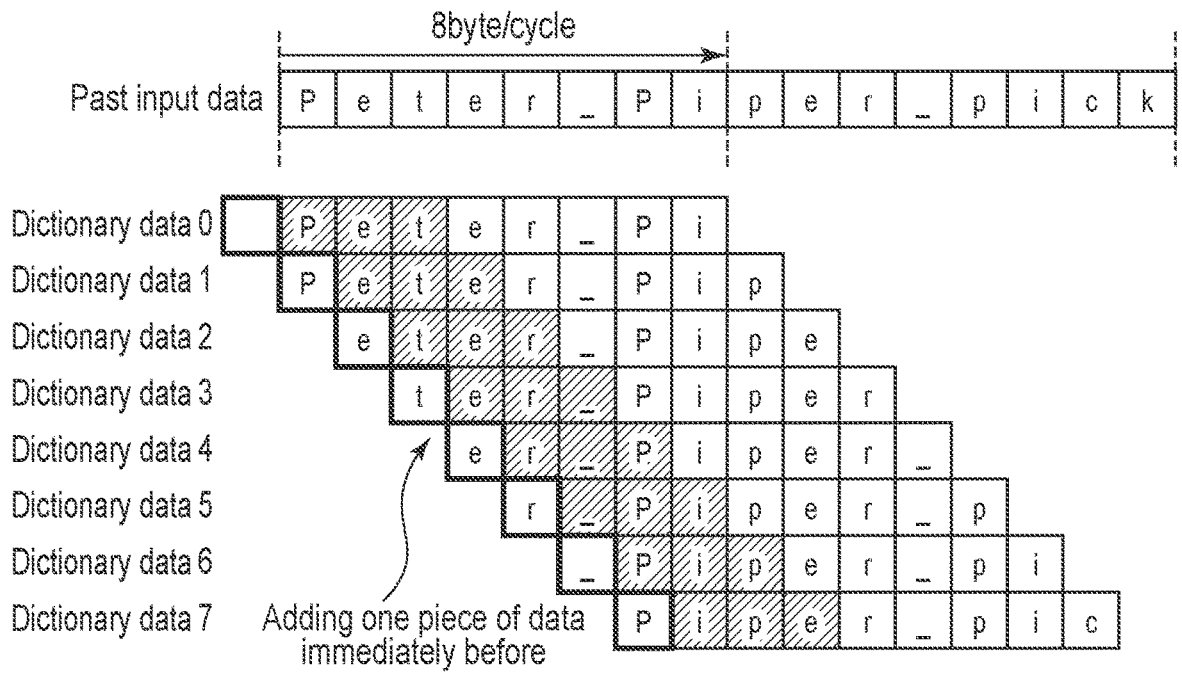
FIG. 5 is a diagram illustrating an example of dictionary data stored in a dictionary buffer in the first embodiment.

Here, FIG. 5 illustrates an example of dictionary data stored in the dictionary buffer 11 in the present embodiment.

FIG. 5 illustrates dictionary data 0 to dictionary data 7 stored in the dictionary buffer 11 based on the past input data in the case in which the input data illustrated in FIG. 2 is set as the past input data. Specifically, for example, the dictionary data 1 is "Peter_Pip" including the substring 1 "eter_Pip" generated from the past input data "Peter_Piper_pick" and data "P" immediately before the substring 1 (i.e., data having a length equivalent to the throughput+1 obtained by adding one piece of data immediately before to the substring 1).

Although the dictionary data 1 including the substring 1 is described here, the same applies to other dictionary data.

Note that in the past input data, there is no data immediately before the substring 0. In this case, for example, the dictionary data 0 including the substring 0 only has to be data indicating a blank or data to which predetermined data is added before the substring 0. On the other hand, in the case in which in referring to the dictionary data 0 including the substring 0, it is determined that data indicating a blank is present or it is determined that there is a blank immediately before the substring 0 from the value of the pointer indicating the position of the substring 0 on the uncompressed data, the match length of the substring 0 is zero.

In addition, the dictionary data 0 to the dictionary data 7 illustrated in FIG. 5 are stored in the dictionary buffer 11 (memory bank corresponding to the substring) using the hash values transformed from the substrings 0 to 7 as dictionary addresses.

In the comparative example to the present embodiment, the description is made that the hash value obtained by performing the hash transform on the data having the length of the shortest match length from the head of the substring is used as the dictionary address. However, in the present embodiment, the hash value obtained by performing the hash transform on the data having the length of the shortest match length−1 from the head of the substring is used as the dictionary address. Note that FIG. 5 illustrates that, for example, hash transform is performed on a hatched part (i.e., "ete" in "eter_Pip") of the substring 1. Although the substring 1 is described here, the hash transform is similarly performed for the other substrings on the hatched part illustrated in FIG. 5.

That is, in the comparative example to the present embodiment described above, the substring which is the data (e.g., eight-byte data) having the length equivalent to the throughput is stored in the dictionary address represented by the hash value transformed from the data having the length of the shortest match length from the head of the substring. However, the present embodiment is different from the comparative example in that the dictionary data which is the data having the length equivalent to the throughput+1 is stored in the dictionary address represented by the hash value transformed from the data having the length of the shortest match length−1 from the head of the substring included in the dictionary data.

Note that although the description is mainly made here that the dictionary data is assumed to be stored in the dictionary buffer 11, the pointer indicating the position of the dictionary data on the uncompressed data is stored in the dictionary buffer 11 together with the dictionary data.

The substring generator 12 generates, from target input data, a plurality of substrings (hereinafter, referred to as a target substring) including consecutive data with each of a plurality of pieces of data included in the target input data as a head.

The hash transformer 13 performs hash transform on each of the target substrings generated by the substring generator 12, and transforms the target substring into a hash value. In this case, the hash transformer 13 performs the hash transform on the data having the length of the shortest match length−1 from the head of the target substring (i.e., the data having the length of the shortest match length−1 from the head is transformed into the hash value).

Here, as described above, the dictionary buffer 11 stores the dictionary data in the dictionary address represented by the hash value transformed from the past substring. Therefore, in the case in which the target substring is transformed into the hash value by the hash transformer 13, the search process on the dictionary buffer 11 is executed using the hash value (as the dictionary address).

Note that in the comparative example to the present embodiment, the description is made that the search process is executed using all of the hash values transformed from the substrings generated from the input data. However, in the present embodiment, the search process is executed solely using the hash value transformed from the odd-numbered target substring (odd substring) among the hash values transformed from the target substrings by the hash transformer 13.

That is, when the hash value transformed from the target substring is referred to as the dictionary address of the target substring, in the search process on the dictionary buffer 11, the dictionary data stored in the dictionary address of the odd-numbered target substring is read from the dictionary buffer 11.

However, the dictionary data stored in the dictionary address of the even-numbered target substring (even-numbered substring) is not read from the dictionary buffer 11.

Note that in the present embodiment, the even-numbered target substring refers to a target substring including, among a plurality of target substrings generated from target input data, consecutive data with the data immediately before the data at the head of the corresponding odd-numbered target substring as a head.

In other words, the even-numbered target substring corresponding to the odd-numbered target substring is the odd-numbered-minus-one target substring.

Hereinafter, the relationship between the odd-numbered and even-numbered target substrings will be described with reference to FIG. 6.

Here, for example, it is assumed that the target input data is "Peter_Piper_pick", and a target substring 0 "Peter_Pi", a target substring 1 "eter_Pip", a target substring 2 "ter_Pipe", a target substring 3 "er_Piper", a target substring 4 "r_Piper_", a target substring 5 "_Piper_p", a target substring 6 "Piper_pi", and a target substring 7 "iper_pic" are generated from the target input data. Among the target substrings 0 to 7 thus generated, the odd-numbered target substrings are target substrings 1, 3, 5, and 7, and the even-numbered target substrings are target substrings 0, 2, 4, and 6.

In this case, in the search process on the dictionary buffer 11 described above, for example, the dictionary data stored in the dictionary address (i.e., the hash value transformed from "ete" of the target substring 1) of the target substring 1, the dictionary address (i.e., the hash value transformed from "er_" in the target substring 3) of the target substring 3, the dictionary address (i.e., the hash value transformed from "_Pi" of the target substring 5) of the target substring 5, and the dictionary address (i.e., the hash value transformed from "ipe" of the target substring 7) of the target substring 7 is read from each of the memory banks included in the dictionary buffer 11. Note that the hatched part illustrated in FIG. 6 indicates data having a length of the shortest match length−1 from the head of the odd-numbered target substring to be transformed into the hash value used in the search process.

Figure 6:
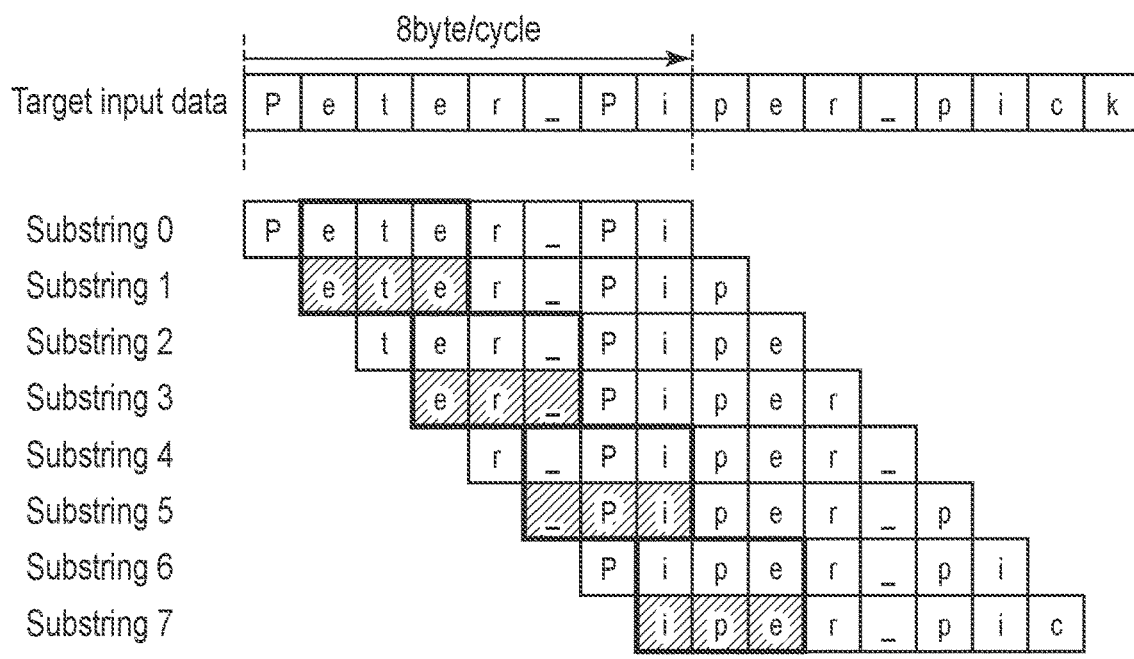
FIG. 6 is a diagram that describes a relationship between odd-numbered and even-numbered target substrings in the first embodiment.

Here, as illustrated in FIG. 6, the first three pieces of data of the target substring 1 (the first data to the third data of the target substring) is data common to the target substring 0 (i.e., the second data to the fourth data of the target substring 0 match the first three pieces of data of the target substring 1). That is, the data having the length of the shortest match length−1 from the head of the odd-numbered target substring (e.g., the target substring 1) transformed into the hash value used for the search process in the present embodiment corresponds to a common part between the data having the length of the shortest match length from the head of the odd-numbered target substring (e.g., the substring 1) and the data having the length of the shortest match length from the head of the even-numbered target substring (e.g., the target substring 0) adjacent to (corresponding to) the odd-numbered target substring.

According to this, as described above, it can be said that the dictionary data stored in the dictionary address of the target substring 1 is a data string including at least the first three pieces of data (i.e., the first data to the third data) of the target substring 1 and the head data (i.e., the data immediately before the target substring 1) of the target substring 0.

Therefore, in the present embodiment, a hash value transformed from data having a length of the shortest match length−1 from the head of the odd-numbered target substring is used as a dictionary address shared between two adjacent target substrings (odd-numbered and even-numbered target substrings). According to this, in the present embodiment, the dictionary data is read from the dictionary address of the target substring 1, and thus it is possible to search not only for data at least partially matched with the target substring 1 but also for data at least partially matched with the target substring 0. In other words, in the present embodiment, it can be said that the search process (i.e., read data from the dictionary buffer 11) on the dictionary buffer 11 is shared between the adjacent target substrings 1 and 0.

Here, the target substrings 1 and 0 are described. However, the other odd-numbered and even-numbered target substrings have a similar relationship.

Note that in the present embodiment, for example, in the case in which a hash value transformed from data having a length of the shortest match length is used as the dictionary address, the hash transform that also takes into consideration of data having a length longer than the shortest match length is substantially performed in the adjacent target substrings, and the search based on the shortest match length is not performed. Therefore, in the present embodiment, a configuration is adopted in which data having a length of the shortest match length−1 from the head of the target substring is transformed into a hash value.

As described above, in the case in which the dictionary data (a match candidate that acquires the match length) is read from the dictionary address of the odd-numbered target substring, the match length acquisition unit 14 compares the data string (hereinafter, the target data string will be referred to as a target data string) including the odd-numbered target substring and the data immediately before the odd-numbered target substring included in the target input data with the read dictionary data to determine whether the data included in the target data string matches the data included in the read dictionary data (i.e., the matching determination is performed). The match length acquisition unit 14 acquires, based on such a determination result (comparison result), at least one match length (hereinafter, referred to as a first match length) indicating a match length between the odd-numbered target substring and the dictionary data and at least one match length (hereinafter, referred to as a second match length) indicating a match length between the even-numbered target substring and the dictionary data.

Here, processing of the match length acquisition unit 14 will be specifically described with reference to FIG. 7. Here, it is assumed that the dictionary data (read data) read from the dictionary address of the odd-numbered target substring is "Peter_Pip". Note that the dictionary data is a data string having a length equivalent to the throughput+1, including the past substring "eter_Pip" and the data "P" immediately before the substring.

In this case, the match length acquisition unit 14 compares the target data string including the odd-numbered target substring transformed into the hash value used at the time of reading the dictionary data "Peter_Pip" and the data immediately before the odd-numbered target substring with the dictionary data "Peter_Pip". As a result, the match length acquisition unit 14 determines, for each piece of data, whether the data included in the target data string matches the data (i.e., character data from "P" to "p") included in the dictionary data "Peter_Pip".

Specifically, the match length acquisition unit 14 determines whether the head data included in the target data string matches the head data "P" included in the dictionary data "Peter_Pip". In addition, the match length acquisition unit 14 determines whether the second data included in the target data string matches the second data "e" included in the dictionary data "Peter_Pip". In the present embodiment, such matching determination for each data included in the target data string and the dictionary data is performed as the process shared between the odd-numbered and even-numbered target substrings.

Here, the dictionary data "Peter_Pip" is data read from a dictionary address represented by a hash value transformed from data having a length of the shortest match length−1 from the head of the odd-numbered target substring (i.e., "ete").

Therefore, the match length acquisition unit 14 counts the number of matches with the target data string from the second data included in the dictionary data "Peter_Pip" based on the result of the matching determination described above, and acquires the counted value as the first match length (the match length of the odd-numbered target substring).

Figure 7:
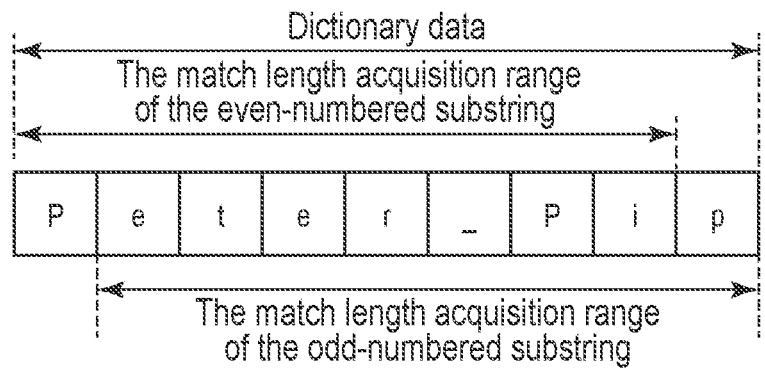
FIG. 7 is a diagram that describes processing of a match length acquisition unit according to the first embodiment.

That is, as illustrated in FIG. 7, it can be said that the match length acquisition range of the odd-numbered target substring (the range of data included in the dictionary data to which reference is made to acquire the first match length) is the second data to the ninth data.

On the other hand, the match length acquisition unit 14 counts the number of matches with the target data string from the head data included in the dictionary data "Peter_Pip" based on the result of the matching determination, and acquires the counted value as the second match length (the match length of the even-numbered target substring).

Note that in the present embodiment, in addition to the above-described shortest match length, it is assumed that the longest match length is further set (predetermined), for example, in order to reduce the cost when searching the dictionary data. The predetermined longest match length is assumed to be, for example, a length equivalent to the throughput (e.g., eight).

In this case, since both of the target data string and the dictionary data are a data string including data of nine characters, the maximum value of the number of matches with the target data string from the head data included in the dictionary data is nine, which exceeds the maximum match length.

Therefore, as illustrated in FIG. 7, the match length acquisition range of the even-numbered target substring (the range of data included in the dictionary data to which reference is made to acquire the second match length) is the first data to the eighth data. According to this, even in the case in which the number of matches between the target data string and the dictionary data exceeds the maximum match length, the second match length can be set to the maximum match length, and thus the second match length can be acquired within a range not exceeding the maximum match length.

That is, the match length acquisition range of the present embodiment has the same length as the length equivalent to the throughput (i.e., the maximum match length) regardless of whether the target substring is an odd-numbered target substring or an even-numbered target substring.

Note that in the example illustrated in FIG. 7, the dictionary data "Peter_Pip" is read from (the dictionary address of the odd-numbered target substring of) the dictionary buffer 11. When the odd-numbered target substring is, for example, the target substring 1 "eter_Pip" illustrated in FIG. 6, eight is obtained as the first match length. In addition, when the even-numbered target substring adjacent to the odd-numbered target substring "eter_Pip" is, for example, the target substring 0 "Peter_Pi" illustrated in FIG. 6, eight is obtained as the second match length.

On the other hand, when the odd-numbered target substring is, for example, "eter_ABC", five is obtained as the first match length. In addition, when the even-numbered target substring is, for example, "Peter_AB", six is obtained as the second match length.

That is, for example, in the case in which the target substrings 0 to 7 are generated from the target input data, in the case in which the dictionary data is read from the dictionary address of the target substring 1, the match lengths (the first and the second match lengths) of the two target substrings 1 and 0 are acquired based on the dictionary data. In addition, in the case in which the dictionary data is read from the address of the target substring 3, the match lengths (the first and the second match lengths) of the two target substrings 3 and 2 are obtained based on the dictionary data. Further, in the case in which the dictionary data is read from the address of the target substring 5, the match lengths (the first and the second match lengths) of the two target substrings 5 and 4 are obtained based on the dictionary data. In addition, in the case in which the dictionary data is read from the address of the target substring 7, the match lengths (the first and the second match lengths) of the two target substrings 7 and 6 are obtained based on the dictionary data.

As described above, in the present embodiment, match lengths of two target substrings (adjacent odd-numbered and even-numbered target substrings) can be acquired from dictionary data read from one dictionary address.

Here, as described above, the dictionary buffer 11 has a plurality of memory banks, and the dictionary data is read from the memory banks. That is, different dictionary data may be read from a plurality of memory banks even for the dictionary address of one odd-numbered substring, and a plurality of first match lengths may be obtained for the odd-numbered target substring. The same applies to the even-numbered target substring.

Therefore, the match length selector 15 selects the longest match length (i.e., the match length indicating the longest match length) in the match lengths (the first match length or the second match length) acquired by the match length acquisition unit 14 for each target substring generated from the target input data. The match length selector 15 outputs the match length (hereinafter, referred to as a selected match length of the target substring) selected for each target substring to the coded data generator 16.

The coded data generator 16 selects a selected match length of each target substring output from the match length selector 15, and generates dictionary-coded data (a compressed stream) for the target input data.

Figure 8:
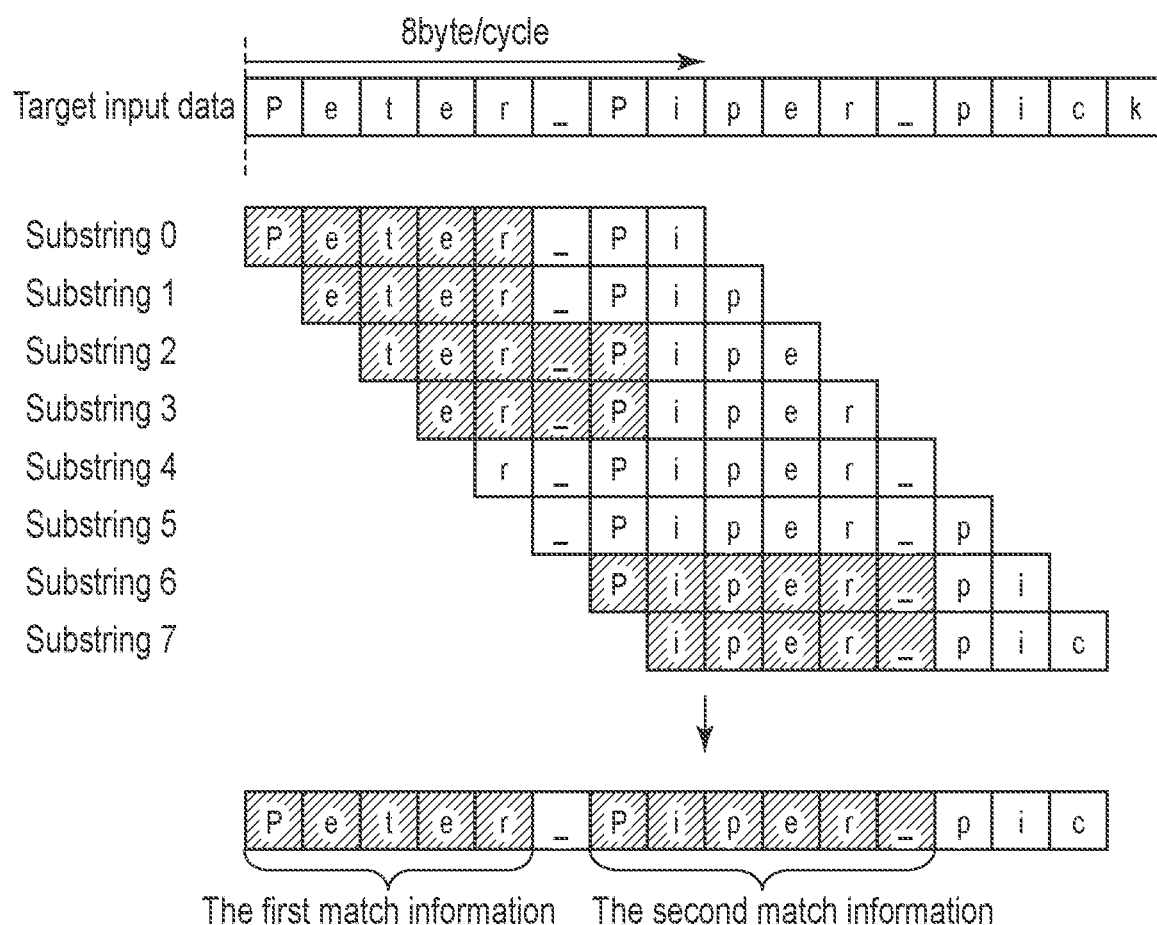
FIG. 8 is a diagram that describes processing of a coded data generator in the first embodiment.

Hereinafter, processing of the coded data generator 16 will be specifically described with reference to FIG. 8. FIG. 8 illustrates an example of the longest match length of the target substrings selected by the match length selector 15.

FIG. 8 illustrates that the selected match length of the target substring 0 is five, the selected match length of the target substring 1 is four, the selected match length of the target substring 2 is five, the selected match length of the target substring 3 is four, the selected match length of the target substring 6 is six, and the selected match length of the target substring 7 is five.

Note that in some cases, the dictionary data is not stored in the dictionary address of the odd-numbered target substring depending on the past input data stored in the dictionary buffer 11. FIG. 8 illustrates that there is no selection match length of the target substrings 4 and 5 (i.e., the match length acquisition unit 14 has not acquired the match lengths of the target substrings 4 and 5) since the dictionary data is not stored in the dictionary address of the target substring 5 (i.e., the dictionary data is not read from the dictionary buffer 11).

In this case, the coded data generator 16 selects at least one selected match length having the highest compression (coding) efficiency for the target input data from the selected match lengths of the respective target substrings, and generates the dictionary-coded data.

Note that in the example illustrated in FIG. 8, efficient compression can be implemented by selecting the selected match length of the target substring 0 and the selected match length of the target substring 6.

In this case, the coded data generator 16 generates the dictionary-coded data including match information (hereinafter, referred to as first match information) including a pair of the selection match length of the target substring 0 and an offset generated from a pointer (hereinafter, referred to as a pointer of the target substring 0) indicating the position on the uncompressed data of the dictionary data including the target substring 0, and match information (hereinafter, referred to as second match information) including a pair of the longest match length of the target substring 6 and an offset generated from a pointer (hereinafter, it is referred to as a pointer of the target substring 6) indicating the position on the uncompressed data of the dictionary data including the target substring 6.

Note that as described above, although the dictionary buffer 11 stores the pointer (hereinafter, referred to as a pointer of dictionary data) indicating the position of the dictionary data (data string) on the uncompressed data together with the dictionary data, the offset generated from the pointer of the target substring 0 corresponds to the difference between the pointer of the target substring 0 and the pointer of the dictionary data (dictionary data read from the dictionary address of the target substring 1) including the target substring 1 corresponding to the target substring 0. Similarly, for example, the offset generated from the pointer of the target substring 6 corresponds to the difference between the pointer of the target substring 6 and the pointer of the dictionary data (dictionary data read from the dictionary address of the target substring 7) including the target substring 7 corresponding to the target substring 6. That is, it can be said that the offset is information indicating the relative position of the dictionary data that matches (at least a part of) the target substring on the uncompressed data from the target substring.

According to this, the coded data generator 16 can generate the dictionary-coded data in which "Peter" of the target input data "Peter_Piper_pick" is replaced with the first match information and "Piper_" of the target input data "Peter_Piper_pick" is replaced with the second match information. The symbol "_" between the first match information and the second match information only has to be included in the dictionary-coded data as it is.

Note that in the present embodiment, the description is made that the dictionary coding is performed using data of two cycles of "Peter_Pi" and "per_pick" as input data. Also, the next processing is executed using data of two cycles including "per_pick" and data of the next cycle as input data. According to this, for example, since the next processing can be started before the second match information is determined, it is possible to improve the processing speed.

Here, the dictionary coding performed on the target input data is mainly described. On the other hand, a plurality of target substrings generated from the target input data is stored (added) in the dictionary buffer 11 for dictionary coding on input data after the target input data. In this case, the dictionary data including the target substring and the data immediately before the target substring included in the target input data is written to the dictionary address (i.e., the dictionary address represented by the hash value transformed from the target substring) of the target substring together with the pointer indicating the position of the dictionary data on the uncompressed data.

The dictionary-coded data generated by the coded data generator 16 as described above is output from the dictionary compression device 10 to an entropy compression device included in the compression device 2e together with the dictionary compression device 10. The entropy compression device performs entropy coding on the dictionary-coded data output from the dictionary compression device 10. The result of entropy coding (i.e., the compressed data based on the dictionary-coded data) is written to the NAND flash memory 3. Note that for example, parity for error correction (ECC parity) may be added to the compressed data written to the NAND flash memory 3.

In the case in which a write command is issued from the host as described above, data (uncompressed data) designated in the write command is compressed by the compression device 2e (the dictionary compression device 10 and the entropy compression device), and (data based on) compressed data output from the compression device 2e is written to the NAND flash memory 3.

On the other hand, in the case in which a read command is issued from the host, the expansion device 2f executes processing on the compressed data. In this case, predetermined processing such as error correction processing and randomization release processing is executed on the data read from the NAND flash memory 3 based on the read command issued from the host, and thus the compressed data is input to the expansion device 2f by the CPU 2b. The expansion device 2f can output the uncompressed data by performing entropy decoding and dictionary decoding on the input compressed data.

As described above, the dictionary compression device 10 according to the present embodiment includes the dictionary buffer that has the memory banks (storage areas) corresponding to the past substrings (first substrings) including the consecutive data with each of the data included in the past input data (first input data) as the head and that stores the dictionary data including the past substring and the data immediately before the past substring included in the past input data in (the dictionary address of) the memory bank corresponding to the past substring. The dictionary address corresponds to the hash value transformed from the past substrings. In addition, the dictionary compression device 10 generates a plurality of target substrings (second substrings) from the target input data (second input data), and transforms each of the target substrings into a hash value. In addition, the dictionary compression device 10 reads the dictionary data from the memory banks included in the dictionary buffer 11 using the hash value transformed from the odd-numbered target substring (third substring) among the target substrings as the dictionary address, and compares the target data string including the odd-numbered target substring and the data immediately before the target substring included in the target input data with the read dictionary data. As a result, the dictionary compression device 10 acquires the match length (first match length) of the odd-numbered target substring and the match length (second match length) of the even-numbered target substring (i.e., the fourth substring including the consecutive data with the data immediately before the data at the head of the third substring as the head) adjacent to the odd-numbered target substring, and generates the dictionary-coded data for the target input data based on the acquired match length.

In the present embodiment, with the above-described configuration, it is possible to reduce the scale of the circuit that achieves a high throughput in the dictionary coding.

Specifically, in the present embodiment, a high throughput in the dictionary coding is achieved by processing each of the target substrings generated from the target input data in parallel, and the hash value transformed from the odd-numbered target substring among the target substrings is solely used in the search process for the dictionary buffer 11 (i.e., the process for reading the dictionary data from the dictionary buffer 11).

That is, the comparative example to the present embodiment described above has a configuration in which the dictionary data is read from the dictionary buffer using all of the hash values transformed from the substrings generated from the input data (i.e., the read number is a square of the number of substrings). However, according to the present embodiment, since the number of dictionary data reads is halved (i.e., the read number is a square of the number of substrings×½) as compared with the comparative example, it is possible to reduce the circuit scale. In other words, in the present embodiment, by sharing the read data (read processing) between the two substrings (odd-numbered and even-numbered target substrings), the number of reads of data from the dictionary buffer 11 is reduced, and it is possible to reduce the circuit scale in the dictionary coding.

Furthermore, in the present embodiment, when the match length is acquired, after the target data string (data string including the odd-numbered target substring and data immediately before the target substring included in the target input data) is compared with the dictionary data read from the dictionary address of the odd-numbered target substring and the matching determination is performed in data units, the number of consecutive matches from the head of each of the odd-numbered and even-numbered target substrings only has to be counted. Therefore, in the present embodiment, for example, it is possible to reduce the circuit scale as compared with a configuration including a circuit (matching number determination circuit) for individually processing the odd-numbered and even-numbered target substrings. In other words, in the present embodiment, by sharing the read data between the two target substrings, it is possible to acquire the match length of each of the two target substrings on a circuit scale smaller than that in which the match number determination circuit is separately prepared for each of the two target substrings.

Note that in the present embodiment, the dictionary data including the target substring and the data immediately before the target substring included in the target input data is written in the memory bank corresponding to the target substring using the hash value transformed from the target substring as an address. According to such a configuration, it is possible to perform the dictionary coding using the target input data (the target substrings) on the input data sequentially processed after the target input data.

In addition, in the present embodiment, data having a length of the shortest match length−1 from the head data of each of a plurality of substrings (past substrings and target substrings) generated from input data is transformed into a hash value, and the shortest match length is the minimum value of the match length acquired in the dictionary coding.

That is, as described above, the shortest match length is predetermined in order to implement efficient search and compression (coding) in the dictionary coding. However, in the present embodiment, by using a hash value transformed from data corresponding to a common part between data having the shortest match length from the head of the odd-numbered target substring and data having the shortest match length from the head of the even-numbered target substring, it is possible to perform search and compression substantially based on the shortest match length even in the case in which read data between two substrings is shared.

In addition, the present embodiment has a configuration in which in the case in which a plurality of match lengths indicating match lengths between the target substring and the dictionary data read from the dictionary buffer 11 is acquired, a match length indicating the longest match length is selected from the match lengths, and the dictionary-coded data is generated based on the selected match length (selected match length), and thus it is possible to improve the compression efficiency (encoding efficiency).

Note that in the present embodiment, the description is made that in the case in which a plurality of match lengths is acquired. In this case, the match length indicating the longest match length is selected from the match lengths. However, the dictionary compression device 10 according to the present embodiment may be configured to generate the dictionary-coded data based on the match lengths (i.e., the dictionary-coded data is generated in consideration of a match length other than the match length indicating the longest match length). In this case, the dictionary compression device 10 can have a configuration in which the match length selector 15 is omitted.

Furthermore, in the present embodiment, since the dictionary data read from the dictionary buffer 11 is a data string having a length equivalent to the throughput+1, there is the case in which the match length between the target data string and the dictionary data read from the dictionary buffer 11 exceeds a predetermined longest match length (length equivalent to the throughput). In the case in which the match length exceeds the predetermined longest match length, a match length indicating the predetermined longest match length is acquired as the match length (second match length) of the even-numbered target substring. According to such a configuration, it is possible to avoid a situation in which appropriate dictionary coding is not performed due to acquisition of a match length exceeding the predetermined longest match length.

Second Embodiment

Next, a second embodiment will be described. Note that in the present embodiment, the detailed description of the same parts as those of the first embodiment described above will be omitted, and parts different from those of the first embodiment will be mainly described. In addition, since the hardware configuration of a memory system in the present embodiment is similar to that of the first embodiment described above, the hardware configuration will be appropriately described with reference to FIG. 1.

The present embodiment is different from the first embodiment in that sharing the read data between the two substrings described in the first embodiment is applied to the dictionary coding of a hash table method.

First, the outline of the dictionary coding of the hash table method will be briefly described. In the first embodiment described above, the data (past substring) is stored in the dictionary buffer using the hash value as the dictionary address. However, in the hash table method, the data is sequentially written in a dictionary buffer. That is, in the hash table method, the dictionary buffer is mounted with a memory that performs writing in sequential address order.

In this case, a table address (a hash value used as a table address) is generated by performing hash transform on data written to the dictionary buffer, and a dictionary address (write address) in which the data is written is stored in (a table entry corresponding to) the table address. In the hash table method, a table from which the dictionary address can be read using the hash value as an index is referred to as a hash table.

In the case in which and search process on the dictionary buffer is executed (data is read from the dictionary buffer) in the dictionary coding of the hash table method, the dictionary address is read from the table address generated by performing the hash transform on the input data with reference to the hash table, and the data is read from the dictionary address.

Note that in the hash table method, when a hash collision occurs, appropriate data is not readable from the dictionary buffer, and there is a concern about performance degradation in the dictionary coding.

In order to alleviate the influence of such a hash collision, a hash table in which a plurality of dictionary addresses is stored in one table address may be mounted, and the structure of such a hash table is referred to as depth.

Here, the case in which the above-described substring is used in the dictionary coding of the hash table method is assumed as a comparative example to the present embodiment. In this case, a table address is generated by performing hash transform on all the substrings generated from the input data, and a dictionary address (i.e., the dictionary address indicating the position where the substring is stored) in consideration of the position of the substring is stored in the table address.

According to this, the dictionary address is read from all of the table addresses generated by performing the hash transform on the substrings generated from the input data, the data is read from the dictionary address, and thus the process of acquiring the match length in the dictionary coding can be executed.

However, in the case in which data is read based on the dictionary address read from the table address generated from the substrings as described above, it is necessary to read the same number of pieces of data as the number of substrings for each cycle, and the circuit scale (circuit for dictionary reading) for reading data from the dictionary buffer becomes very large. Note that in the case in which the structure (hereinafter, referred to as a depth structure) referred to as the depth described above is adopted in the hash table, the number of data reads increases, and thus an increase in the circuit scale becomes more remarkable.

Hereinafter, the dictionary compression device according to the present embodiment will be described in detail. FIG. 9 is a block diagram illustrating an example of a configuration of the dictionary compression device according to the present embodiment.

As illustrated in FIG. 9, a dictionary compression device 20 includes a dictionary buffer 21, a hash table 22, a substring generator 23, a hash transformer 24, a match length acquisition unit 25, a match length selector 26, a coded data generator 27, and a write controller 28.

In the present embodiment, the dictionary compression device 20 is configured to compress the uncompressed data by dictionary coding of the hash table method. In this case, the uncompressed data includes, for example, a plurality of pieces of consecutive data, and the dictionary compression device 20 uses a part of the uncompressed data as input data and sequentially performs the dictionary coding on the input data.

Here, similarly to the first embodiment described above, a description will be given assuming that dictionary coding is performed on predetermined input data (past input data) of the uncompressed data, and then dictionary coding is performed on input data (hereinafter, referred to as target input data) after the past input data.

The dictionary buffer 21 stores past input data. The hash table 22 stores a dictionary address (a position of the substring in the dictionary buffer 21) in which (data matched with) the substring is stored using, as a table address, a hash value transformed from each of a plurality of past substrings including consecutive data with each of a plurality of pieces of data included in the past input data as a head.

The substring generator 23 is a functional unit similar to the substring generator 12 in the first embodiment described above, and generates a plurality of substrings (target substrings) from target input data.

The hash transformer 24 is a functional unit similar to the hash transformer 13 in the first embodiment described above, performs hash transform on each of the target substrings generated by the substring generator 23, and transforms the target substring into a hash value. It is assumed that the hash transformer 24 performs the hash transform on the data having the length of the shortest match length−1 from the head of the target substring similarly to the first embodiment described above.

Here, the hash value transformed from each of the target substrings by the hash transformer 13 is used as the table address (hereinafter, referred to as a table address of the target substring) of the hash table 22. However, in the search process for the dictionary buffer 11 (the process for reading the dictionary data from the dictionary buffer 11) in the present embodiment, the table address of the odd-numbered target substring among the table addresses of the target substrings is solely used.

According to this, by referring to the hash table 22, the dictionary address is read from the table address of the odd-numbered target substring, and the read dictionary address (read address) is output from the hash table 22 to the dictionary buffer 21. Note that in the case in which the hash table 22 adopts the depth structure described above, a plurality of dictionary addresses may be read from one table address.

The data stored in the dictionary buffer 21 is read from the dictionary buffer 21 based on the dictionary address output from the hash table 22. In the present embodiment, the data (hereinafter, referred to as dictionary data) read from the dictionary buffer 21 is a data string having a length equivalent to the throughput+1 including the past substring (i.e., the substring generated from the past input data) stored in the dictionary address output from the hash table 22 and the data immediately before the past substring included in the past input data. In other words, in the present embodiment, the number of pieces of data read from the dictionary buffer 21 is the number of substrings/2 (×the number of depths), and it is possible to reduce the number of pieces of data read from the dictionary buffer 21 (i.e., the scale of the circuit that reads data from the dictionary buffer 21).

The match length acquisition unit 25 is a functional unit similar to the match length acquisition unit 14 in the first embodiment described above, and acquires a match length (first match length) indicating a match length between the odd-numbered target substring and the dictionary data and a match length (second match length) indicating a match length between the even-numbered target substring and the dictionary data by comparing a data string (target data string) including the odd-numbered target substring and data immediately before the target substring included in the target input data with the dictionary data (match candidate that acquires the match length) read from the dictionary buffer 21. In other words, the match length acquisition unit 25 can acquire the match lengths of two adjacent target substrings (odd-numbered and even-numbered target substrings) from one read data (dictionary data).

Note that according to such a configuration, similarly to the first embodiment described above, after the matching determination for the target data string and the dictionary data is performed in units of data, the number of pieces of data that continuously match from the head of each of the odd-numbered and even-numbered target substrings only has to be counted, and thus it is possible to reduce the circuit scale as compared with the case of preparing a circuit (match number determination circuit) that individually acquires the match length for the odd-numbered and even-numbered target substrings.

Here, in the case in which the hash table adopts the depth structure as described above, there is a possibility that a plurality of match lengths is acquired for one target substring by reading a plurality of dictionary addresses from one table address.

Therefore, the match length selector 26 selects the longest match length among the match lengths (the first match length or the second match length) acquired by the match length acquisition unit 25 for each target substring generated from the target input data. Note that the match length selector 26 is a functional unit similar to the match length selector 15 in the first embodiment described above.

The coded data generator 27 is a functional unit similar to the coded data generator 16 in the first embodiment described above, and generates the dictionary-coded data for the target input data based on the match length (selected match length) of each target substring selected by the match length selector 26.

Note that as described in the first embodiment, the coded data generator 27 generates the dictionary-coded data by replacing (at least a part of) the target input data with the above-described match information, and the match information includes the match length and the offset. In the first embodiment described above, the description is made that the offset included in the match information is generated using the pointer (the position of the past input data on the uncompressed data) read from the dictionary buffer 11. However, in the present embodiment, since the past input data is sequentially stored in the dictionary buffer 21, the offset can be generated using the pointer (the position on the uncompressed data) based on the dictionary address in which the past input data is stored. That is, it can be said that the offset is information indicating the relative position from the pointer based on the dictionary address storing the target input data and the pointer based on the dictionary address storing the matching dictionary data (past input data).

Here, the dictionary coding performed on the target input data is mainly described. However, the target input data is written to the dictionary buffer 21 for the dictionary coding on the input data after the target input data. Note that in the dictionary buffer 21, data corresponding to the throughput (data corresponding to a part replaced with the dictionary-coded data) in the target input data is written.

In addition, in the hash table 22, a dictionary address storing (data matching) the target substring is written using, as a table address, a hash value transformed from a plurality of target substrings generated from the target input data.

Note that the write process to the dictionary buffer 21 and the hash table 22 is controlled by the write controller 28. Specifically, the write controller 28 operates to increment (update) the dictionary address according to the throughput of the input data and to designate the dictionary address to the dictionary buffer 21 and the hash table 22.

According to this, the target input data (data corresponding to the throughput thereof) is written to the dictionary buffer 21 according to the dictionary address designated from the write controller 28.

On the other hand, in the hash table 22, the dictionary address in which (the data matching) the target substring is stored is written in the table address (the table address of the target substring) represented by the hash value transformed from the target substrings as described above. Therefore, the dictionary address to be written to the table address of the target substring is a value obtained by adding the substring number of the target substring to the dictionary address (i.e., the position in the dictionary buffer 21 in which the head data of the target input data is stored) designated from the write controller 28. Specifically, for example, the dictionary address (+0) designated from the write controller 28 is written in the table address of the target substring 0, and the dictionary address designated from the write controller 28+1 is written in the table address of the target substring 1. According to this, the dictionary address indicating the position of (the head data of) the target substring in the dictionary buffer 21 can be written to the table address of each target string.

Note that in the case in which the dictionary address is written to the hash table 22 adopting the depth structure, the hash table 22 only has to be operated to discard one oldest dictionary address for each table address and to maintain the remaining dictionary addresses of the depth number−1 without discarding.

That is, in the present embodiment, the table address of the odd-numbered target substring is solely used for reading the dictionary data. However, the process is executed for both of the even-numbered and odd-numbered substrings for writing the dictionary data.

As described above, the dictionary compression device 20 according to the present embodiment includes the dictionary buffer 21 that stores past input data (first input data), and the hash table 22 that stores the dictionary address in which the past substring is stored, using the hash value transformed from each of the past substrings (first substrings) including consecutive data with each of the data included in the past input data as the head as the table address. The dictionary compression device 20 generates a plurality of target substrings from target input data (second input data), and transforms each of the second substrings into a hash value. In addition, the dictionary compression device 20 reads the dictionary address from the hash table 22 using the hash value transformed from the odd-numbered target substring (third substring) as the table address, and reads the dictionary data including the past substring stored in the dictionary address and the data immediately before the past substring included in the past input data from the dictionary buffer 21 based on the read dictionary address. Further, the dictionary compression device 20 compares the target data string including the odd-numbered substring and the data immediately before the odd-numbered substring included in the target input data with the read dictionary data. As a result, the dictionary compression device 20 acquires the match length (first match length) of the odd-numbered target substring and the match length (second match length) of the even-numbered target substring (fourth substring) adjacent to the odd-numbered target substring, and generates the dictionary-coded data for the target input data based on the acquired match length.

According to the configuration of the present embodiment described above, similarly to the first embodiment described above, the number of reads of data with respect to the dictionary buffer 21 is reduced by sharing the read data (read processing) between the two substrings, and thus it is possible to reduce the scale of the circuit that achieves a high throughput in the dictionary coding.

Furthermore, in the present embodiment, since the configuration is such that the dictionary address is read (i.e., the dictionary address is not read from the table address of the even-numbered target substring) from the table address of the odd-numbered target substring, it is possible to reduce the scale of the circuit that reads the dictionary address from the hash table 22 (the table reading circuit of the hash table 22).

In addition, as described above, in the case in which the hash table adopts the depth structure, for example, the number of times of reading the dictionary data from the dictionary buffer increases, and thus, it can be said that the present embodiment is more useful in the case in which the hash table 22 adopts the depth structure (i.e., the hash table 22 stores a plurality of dictionary addresses in the same table address).

Note that in the present embodiment, the target input data is written to the dictionary buffer 21, and the dictionary address in which (the data matching) the target substring is written is written to the hash table 22 using the hash value transformed from the target substring as the table address. According to such a configuration, it is possible to perform the dictionary coding using the target input data on the input data sequentially processed after the target input data.

In addition, the dictionary compression device 20 according to the present embodiment may be configured not to include the match length selector 26 unlike the first embodiment described above.

Third Embodiment

Next, a third embodiment will be described. Note that in the present embodiment, the detailed description of the same parts as those of the first embodiment described above will be omitted, and parts different from those of the first embodiment will be mainly described. In addition, since the hardware configuration of a memory system of the present embodiment is similar to that of the first embodiment described above, the hardware configuration will be appropriately described with reference to FIG. 1.

The present embodiment is different from the first embodiment in that sharing the read data between the two substrings described in the first embodiment is applied to the dictionary coding of a hash full search method.

First, the outline of the dictionary coding of the hash full search method will be briefly described. In the hash full search method, transformed data including a pair of a hash value (i.e., the hash value transformed from each of the pieces of data included in the past input data) obtained by performing hash transform on the past input data in units of one piece of data and complementary data that inversely transforms the hash value into the data is stored in a dictionary buffer.

In the case in which a search process on the dictionary buffer is executed in the dictionary coding of the hash full search method, determination whether the hash value (the hash value on the dictionary) included in the transformed data stored in the dictionary buffer matches the hash value transformed from each of the pieces of data included in the input data is performed (i.e., it is determined whether the hash values match) in a brute-force manner, and the transformed data string in which the hash values of the number equal to or greater than the shortest match length (minimum match length) continuously match is read from the dictionary buffer.

Figure 10:
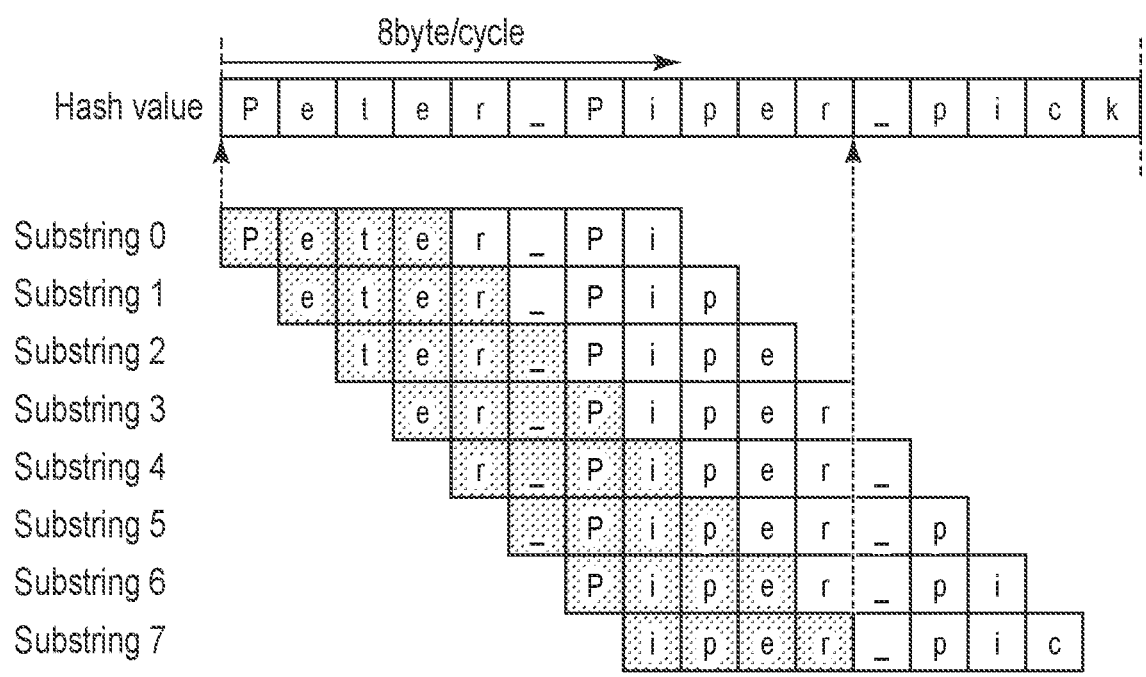
FIG. 10 is a diagram that describes dictionary coding by a hash full search method using substrings in a comparative example to a third embodiment.

Here, the dictionary coding of the hash full search method using the above-described substring will be described as a comparative example to the present embodiment with reference to FIG. 10. In FIG. 10, for example, it is assumed that the input data is "Peter_Piper_pick", and a plurality of substrings 0 to 7 including continuous transformed data with each of a plurality of pieces of transformed data as a head is generated from a plurality of pieces of continuous transformed data (hash values) transformed from a plurality of pieces of data included in the input data. That is, in FIG. 10, all characters such as "P" and "e" represent transformed data (hash value) transformed from the characters (data).

In the dictionary coding of the hash full search method, it is necessary to search the dictionary buffer for the transformed data string at least partially matched with the substrings 0 to 7. Accordingly, in the comparative example to the present embodiment, the scale of a circuit (i.e., a circuit that achieves the hash full search), which achieves the matching determination of the hash value of one piece of data unit of the search target data×the dictionary size in the input data and the determination of the number of hash values continuously matched with the substring×the dictionary size (continuous matching number determination), is increased. Note that as described above, in the case in which the transformed data string in which the number of hash values equal to or larger than the shortest match length continuously matches is read from the dictionary buffer, as illustrated in FIG. 10, the search target data is a transformed data string (data of a length equivalent to the throughput+a length of the shortest match length−1) transformed in units of one piece of data from "Peter_Piper" of the input data. Here, it is assumed that the shortest match length is four.

In addition, since it is necessary to make reference to the entire dictionary buffer at the same time in the dictionary coding of the hash full search method, it is assumed that the dictionary buffer is configured using a flip-flop circuit instead of an SRAM. In this case, a circuit that selects data according to the dictionary address (pointer indicating the position in the dictionary buffer) output as a result of the search process described above is necessary. However, the circuit needs to be prepared in parallel by the number of pieces of data read from the dictionary (i.e., the number of match candidates for obtaining the match length), and the circuit scale increases.

Hereinafter, the dictionary compression device according to the present embodiment will be described in detail. FIG. 11 is a block diagram illustrating an example of a configuration of the dictionary compression device according to the present embodiment.

As illustrated in FIG. 11, a dictionary compression device 30 includes a dictionary buffer 31, a hash transformer 32, a substring generator 33, a hash full search unit 34, a dictionary data selector 35, a match length acquisition unit 36, a match length selector 37, a coded data generator 38, and an inverse hash transformer 39.

In the present embodiment, the dictionary compression device 30 is configured to compress uncompressed data by dictionary coding of the hash full search method. In this case, the uncompressed data includes, for example, a plurality of pieces of consecutive data, and the dictionary compression device 30 uses a part of the uncompressed data as input data and sequentially performs the dictionary coding on the input data.

Here, similarly to the first embodiment described above, a description will be given assuming that dictionary coding is performed on predetermined input data (past input data) of the uncompressed data, and then dictionary coding is performed on input data (hereinafter, referred to as target input data) after the past input data.

The dictionary buffer 31 stores, for each data, a hash value transformed from each of a plurality of pieces of data included in past input data and transformed data (hereinafter, past transformed data) including complementary data that inversely transforms the hash value into the data. It is assumed that the past transformed data is stored in the dictionary buffer 31 in the order of (data included in) the past input data transformed into the transformed data (i.e., sequentially).

Unlike the first (and second) embodiment described above, the hash transformer 32 transforms each of a plurality of pieces of data included in target input data into transformed data including a pair of a hash value and complementary data that inversely transforms the hash value into the data. That is, the hash transformer 32 performs hash transform in units of one piece of data and generates complementary data. Note that the hash transformer 32 is configured to simultaneously perform a number of hash transforms corresponding to the throughput in one cycle, for example.

The substring generator 33 generates, from a plurality of pieces of transformed data transformed from (a plurality of pieces of data included in) the target input data by the hash transformer 32, a plurality of substrings (target substrings) including continuous transformed data with the pieces of transformed data as a head. That is, the substring generator 33 is a functional unit similar to the substring generator 12 in the first embodiment described above. However, the substring generator 33 is different from the substring generator 12 in that data to generate a target substring is transformed data (i.e., the data after the hash transform is performed).

Here, the hash values included in all the past transformed data stored in the dictionary buffer 31 are output from the dictionary buffer 31 to the hash full search unit 34, and the hash full search unit 34 performs the hash full search on the hash value output from the dictionary buffer 31.

In the present embodiment, the hash value of the odd-numbered target substring of the hash values (hereinafter, referred to as a hash value of the target substring) of the transformed data included in the target substrings generated by the substring generator 33 and the hash value output from the dictionary buffer 31 are used as inputs, and it is determined whether the both match in a brute-force manner. In other words, the hash full search unit 34 performs a brute-force matching determination (comparison) of searching for all the hash values matching the hash value of the odd-numbered target substring from the hash values output from the dictionary buffer 31, for example. Note that the hash value of the odd-numbered target substring in the present embodiment refers to a hash value included in each of the pieces of transformed data corresponding to the length of the shortest match length−1 from the head among the pieces of transformed data included in the target substring.

That is, in FIG. 10 described above, the description is made that the data having the length equivalent to the throughput+the length of the shortest match length−1 is the search target data. However, in the present embodiment, as illustrated in FIG. 12, the data having the length of "(the length equivalent to the throughput−1)+(the shortest match length−1)−1" is the search target data. Furthermore, in the present embodiment, the continuous matching number determination described above is an odd-numbered target substring×dictionary size full search. According to such a configuration, it is possible to reduce the scale of the circuit that achieves the hash full search.

In the case in which the number of consecutive matching hash values, the number of which is the shortest match length−1, is found by the consecutive matching number determination (i.e., a hash value matching the consecutive hash values of the odd-numbered target substring exists in the dictionary buffer 31), the hash full search unit 34 outputs, to the dictionary data selector 35, a pointer indicating the position in the dictionary buffer 31 of the transformed data including the found hash value.

In this case, all the transformed data stored in the dictionary buffer 31 is output from the dictionary buffer 31 to the dictionary data selector 35, and the dictionary data selector 35 selects a transformed data string (hereinafter, referred to as dictionary data) including continuous transformed data as a match candidate based on the pointer output from the hash full search unit 34 from the transformed data output from the dictionary buffer 31.

Note that the pointer output from the hash full search unit 34 indicates, for example, a position (address) in the dictionary buffer 31 storing the head transformed data among the transformed data including each of the consecutive hash values searched by the hash full search unit 34. In this case, the dictionary data selected by the dictionary data selector 35 is a transformed data string having a length equivalent to the throughput+1 including consecutive transformed data (i.e., the transformed data string having the length equivalent to the throughput equivalent to the odd-numbered substring) starting from the transformed data stored at the position indicated by the pointer output from the hash full search unit 34 and the transformed data (i.e., the head transformed data of the even-numbered target substring corresponding to the odd-numbered target substring) immediately before the transformed data stored at the position in the dictionary buffer 31.

By sharing the selection of the dictionary data between the two target substrings (odd-numbered and even-numbered target substrings) in this manner, it is possible to reduce the circuit scale as compared with the case of preparing a circuit that individually selects the dictionary data for the two target substrings.

The match length acquisition unit 36 is a functional unit corresponding to the match length acquisition unit 14 in the first embodiment described above. However, the match length acquisition unit 36 is different from the match length acquisition unit 14 in that data to be compared for acquiring a match length is transformed data. The match length acquisition unit 36 compares a transformed data string (target data string) including an odd-numbered target substring and transformed data immediately before the odd-numbered target substring with the dictionary data selected by the dictionary data selector 35, and acquires a match length (first match length) indicating a match length between the odd-numbered target substring and the dictionary data and a match length (second match length) indicating a match length between an even-numbered target substring including continuous transformed data with the transformed data immediately before the head transformed data of the odd-numbered target substring as a head and the dictionary data. In other words, the match length acquisition unit 36 can acquire the match lengths of two adjacent target substrings (odd-numbered and even-numbered target substrings) from one read data (dictionary data).

Note that according to such a configuration, after the matching determination for the target data string and the dictionary data is performed in units of transformed data, the number of pieces of transformed data continuously matching from the heads of the odd-numbered and even-numbered target substrings is counted. Therefore, it is possible to reduce the circuit scale as compared with the case in which a circuit (matching number determination circuit) for individually acquiring the match length for the odd-numbered and even-numbered target substrings is prepared.

Here, in the present embodiment, since the hash full search is performed on the hash value output from the dictionary buffer 31, there is a possibility that a plurality of dictionary data at least partially matching one odd-numbered target substring is selected (i.e., a plurality of match lengths is obtained for one target substring) by the dictionary data selector 35.

Therefore, the match length selector 37 selects the longest match length among the match lengths (the first match length or the second match length) acquired by the match length acquisition unit 36 for each target substring generated by the substring generator 33. Note that the match length selector 37 is a functional unit similar to the match length selector 15 in the first embodiment described above.

The coded data generator 27 is a functional unit similar to the coded data generator 16 in the first embodiment described above, and generates the dictionary-coded data for the target input data based on the match length (selected match length) of each target substring selected by the match length selector 37.

Note that as described in the first embodiment, the coded data generator 38 generates the dictionary-coded data by replacing (at least a part of) the target input data with the above-described match information, and the match information includes the match information and the offset. In the first embodiment described above, the description is made that the offset included in the match information is generated using the pointer (the position on the uncompressed data of the past input data) read from the dictionary buffer 11. However, in the present embodiment, since a plurality of pieces of transformed data transformed from the past input data is sequentially stored in the dictionary buffer 31, the offset can be generated using the pointer (the position on the uncompressed data) based on the dictionary address storing the transformed data transformed from the past input data. That is, it can be said that the offset is information indicating the relative position from the pointer based on the dictionary address storing the target input data and the pointer based on the dictionary address storing the matching dictionary data (past input data).

The inverse hash transformer 39 inversely transforms the hash value included in the transformed data stored in the dictionary buffer 31 into data using the complementary data included in the transformed data (inverse hash transform). In the dictionary-coded data generated by the above-described coded data generator 38, data that is not replaceable with the match information is included in the dictionary-coded data as it is. Therefore, the data inversely transformed from the hash value by the inverse hash transformer 39 is used as data that is not replaceable with the match information in the generation of the dictionary-coded data.

Here, the dictionary coding performed on the target input data is mainly described. However, a plurality of pieces of transformed data transformed from the target input data in units of one piece of data by the hash transformer 32 is sequentially written to the dictionary buffer 31 for the dictionary coding on the input data after the target input data.

As described above, the dictionary compression device 30 according to the present embodiment includes the dictionary buffer that stores the transformed data (first transformed data) including the hash value (first hash value) transformed from each of the pieces of data included in the past input data (first input data) and the complementary data (first complementary data) that inversely transforms the hash value into the data for each piece of the data. In addition, the dictionary compression device 30 transforms each of the pieces of data included in the target input data (second input data) into transformed data (second transformed data) including a hash value (second hash value) and complementary data (second complementary data) that inversely transforms the hash value into the data, and generates a plurality of target substrings (first substrings) including continuous transformed data with each of the pieces of transformed data as a head from a plurality of continuous transformed data transformed from each of the pieces of data included in the target input data. Further, the dictionary compression device 30 searches for the hash value included in the continuous transformed data included in the odd-numbered target substring (second substring) among the target substrings from the hash values included in the transformed data stored in the dictionary buffer 31, and performs the hash full search to output the pointer indicating the position in the dictionary buffer 31 of the transformed data including the hash value in the case in which there is the hash value matching the continuous hash value of the odd-numbered target substring. In addition, the dictionary compression device 30 selects, from the dictionary buffer 31, the dictionary data including the consecutive transformed data starting from the transformed data stored at the position in the dictionary buffer 31 indicated by the pointer output by the hash full search and the transformed data immediately before the transformed data stored at the position in the dictionary buffer 31, and compares the target data string including the odd-numbered target substring and the transformed data immediately before the odd-numbered target substring with the selected dictionary data. As a result, the dictionary compression device 30 acquires the match length (first match length) of the odd-numbered target substring and the match length (second match length) of the even-numbered target substring (fourth substring) adjacent to the odd-numbered target substring, and generates the dictionary-coded data for the target input data based on the acquired match length.

According to the configuration of the present embodiment described above, by sharing the read data (dictionary data selection processing) between the two substrings, it is possible to reduce the scale of circuits (the hash value matching determination circuit and the consecutive matching number determination circuit), which achieve the hash full search.

Here, in the case in which the number of match candidates is large, processing of narrowing down the match candidates is necessary, and a circuit that executes the processing of narrowing down the match candidates may become a factor of an increase in the scale of a circuit that performs the dictionary coding. On the other hand, in the present embodiment, since the hash full search is performed solely for the odd-numbered target substring, it is possible to reduce the number of match candidates, and it is possible to reduce the scale of the circuit that executes the process of narrowing down the match candidates.

Note that in the present embodiment, with the configuration in which the transformed data transformed from the target input data is written to the dictionary buffer 31, it is possible to perform the dictionary coding using the target input data (transformed data) on the input data sequentially processed after the target input data.

In addition, in the present embodiment, the description is made that the dictionary compression device 30 has the configuration illustrated in FIG. 11. However, the dictionary compression device 30 may have another configuration.

Specifically, in the present embodiment, the description is made assuming that the transformed data included in the target substring is compared with the transformed data included in the dictionary data in order to obtain the match length. However, a configuration may be provided in which the hash value included in the transformed data is inversely transformed into data using the complementary data included in the transformed data, and the data (e.g., character data) obtained by the inverse transform is compared to obtain the match length.

Furthermore, in the present embodiment, for the transformed data determined to match by the hash full search unit 34, matching of the transformed data may be confirmed by comparing the complementary data included in the transformed data with the complementary data included in the transformed data included in the target substring.

That is, the present embodiment is applicable as long as the read data (selection of dictionary data) from the dictionary buffer 31 that stores the transformed data transformed from the input data is shared between the two substrings.

In addition, the dictionary compression device 30 according to the present embodiment may be configured not to include the match length selector 37 similarly to the first embodiment described above.

According to at least one embodiment described above, it is possible to provide a dictionary compression device and a memory system capable of reducing the scale of the circuit that achieves a high throughput.

Note that in the first to the third embodiments described above, the description is made that the circuit scale is reduced by sharing the read data between two adjacent substrings. However, the first to the third embodiments may be further extended to have a configuration in which the read data is shared among three or more adjacent substrings. In this case, the size of the read data (dictionary data read from the dictionary buffer) only has to be set to "the length equivalent to the throughput+(the number of substrings to be shared−1)", and the size of a part of the input data transformed into the hash value in the first and second embodiments (the hash input data size) and the number of consecutively matched hash values (the number of consecutive matches) searched in the third embodiment only has to be set to "the shortest match length−(the number of substrings to be shared−1)".

However, when the hash input data size and the number of consecutive matches described above decrease, there is a high possibility that a match candidate is erroneously searched (erroneously detected) due to a hash collision. Therefore, the configuration in which the read data is shared among the three or more adjacent substrings is preferably applied to a dictionary compression device in which the number of pieces of data (i.e., the throughput) that can be processed in one cycle and the shortest match length are large.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A dictionary compression device configured to compress uncompressed data including first input data and second input data by performing dictionary coding on the second input data subsequent to the first input data after performing dictionary coding on the first input data including a plurality of pieces of consecutive data, the dictionary compression device comprising:
- a dictionary buffer including a plurality of storage areas and configured to store dictionary data in a dictionary address of a storage area of the plurality of storage areas, each of the plurality of storage areas corresponding to each of a plurality of first substrings, each of the plurality of first substrings including consecutive data, each of the plurality of first substrings including each of a plurality of pieces of data included in the first input data as a head, the dictionary data including a first substring and data before the first substring included in the first input data, the storage area corresponding to the first substring, the dictionary address corresponding to a hash value transformed from the first substrings;
- a substring generator configured to generate, from the second input data, a plurality of second substrings, each of the plurality of second substrings including consecutive data, each of the plurality of second substrings including each of a plurality of pieces of data included in the second input data as a head;
- a transformer configured to transform each of the second substrings into a hash value;
- a read processor configured to read the dictionary data from a plurality of storage areas included in the dictionary buffer, using a hash value transformed from a third substring among the second substrings as a dictionary address;
- an acquisition unit configured to compare a data string including the third substring and data before the third substring included in the second input data with the read dictionary data, and acquire at least one first match length indicating a match length between the third substring and the read dictionary data and at least one second match length indicating a match length between a fourth substring including consecutive data having data before data at a head of the third substring as a head and the read dictionary data; and
- a coded data generator configured to generate coded data for the second input data based on the acquired first and second match lengths, wherein
- dictionary data including the second substring and data before the second substring included in the second input data is written in a storage area corresponding to the second substring, with a hash value that is transformed from the second substring as a dictionary address.

2. The dictionary compression device according to claim 1, wherein
data having a length of a shortest match length−1 from a head of each of the first substrings and the second substrings is transformed into a hash value, and
the shortest match length is a minimum value of a first match length and a second match length acquired by the acquisition unit.

3. The dictionary compression device according to claim 1, further comprising
a selector configured to select a first match length indicating a longest match length from a plurality of first match lengths when the first match lengths indicating a match length between the third substring and the read dictionary data are acquired, and select a second match length indicating a longest match length from a plurality of second match lengths when the second match lengths indicating a match length between the fourth substring and the read dictionary data are acquired, wherein
the coded data generator is configured to generate the coded data based on the selected first and second match lengths.

4. The dictionary compression device according to claim 1, wherein the acquisition unit is configured to acquire a second match length indicating a predetermined longest match length when a match length between the data string and the read dictionary data exceeds the predetermined longest match length.

5. A dictionary compression device configured to compress uncompressed data including first input data and second input data by performing dictionary coding on the second input data subsequent to the first input data after performing dictionary coding on the first input data including a plurality of pieces of consecutive data, the dictionary compression device comprising:
- a dictionary buffer configured to store the first input data;
- a hash table configured to store a dictionary address in which the first substring is stored, using, as a table address, a hash value transformed from each of a plurality of first substrings including consecutive data, each of the plurality of first substrings including each of a plurality of pieces of data included in the first input data as a head;
- a substring generator configured to generate, from the second input data, a plurality of second substrings including consecutive data, each of the plurality of second substrings including each of a plurality of pieces of data included in the second input data as a head;
- a transformer configured to transform each of the second substrings into a hash value;
- a first read processor configured to read the dictionary address from the hash table using a hash value transformed from a third substring among the second substrings as a table address;
- a second read processor configured to read, from the dictionary buffer, dictionary data including a first substring stored in the dictionary address and data before the first substring included in the first input data based on the read dictionary address;
- an acquisition unit configured to compare a data string including the third substring and data before the third substring included in the second input data with the read dictionary data, and acquire at least one first match length indicating a match length between the third substring and the read dictionary data and at least one second match length indicating a match length between a fourth substring including consecutive data having data before data at a head of the third substring as a head and the read dictionary data; and
- a coded data generator configured to generate coded data for the second input data based on the acquired first and second match lengths, wherein
the second input data is written to the dictionary buffer, and
the dictionary address in which the second substring is written is written in the hash table using a hash value transformed from the second substring as a table address.

6. The dictionary compression device according to claim 5, wherein
a part of the first substring and the second substring corresponding to a shortest match length −1 from head data of each of the first substrings and the second substrings is transformed into a hash value, and the shortest match length is a minimum value of a first match length and a second match length acquired by the acquisition unit.

7. The dictionary compression device according to claim 5, further comprising a selector configured to select a first match length indicating a longest match length from a plurality of first match lengths when the first match lengths indicating a match length between the third substring and the read dictionary data are acquired, and select a second match length indicating a longest match length from a plurality of second match lengths when the second match lengths indicating a match length between the fourth substring and the read dictionary data are acquired, wherein the coded data generator is configured to generate the coded data based on the selected first and second match lengths.

8. The dictionary compression device according to claim 5, wherein the acquisition unit is configured to acquire a second match length indicating a predetermined longest match length when a match length between the data string and the read dictionary data exceeds the predetermined longest match length.

9. The dictionary compression device according to claim 5, wherein the hash table is configured to store a plurality of dictionary addresses in a same table address.

10. A dictionary compression device configured to compress uncompressed data including first input data and second input data by performing dictionary coding on the second input data subsequent to the first input data after performing dictionary coding on the first input data including a plurality of pieces of consecutive data, the dictionary compression device comprising:

a dictionary buffer configured to store, for each piece of data, first transformed data including a first hash value transformed from each of a plurality of pieces of data included in the first input data and first complementary data used to inversely transform the first hash value into the data;

a transformer configured to transform each of a plurality of pieces of data included in the second input data into second transformed data including a second hash value and second complementary data used to inversely transform the second hash value into the data;

a substring generator configured to generate a plurality of first substrings from a plurality of consecutive pieces of second transformed data transformed from each of a plurality of pieces of data included in the second input data, the first substrings including the consecutive pieces of second transformed data having each of the pieces of second transformed data as a head;

a search unit configured to search for a second hash value included in consecutive second transformed data included in a second substring among the first substrings from first hash values included in the first transformed data stored in the dictionary buffer, and output a pointer indicating a position of the first transformed data including the first hash value in the dictionary buffer when there is a first hash value matching the consecutive second hash value;

a selector configured to select, from the dictionary buffer, dictionary data including consecutive first transformed data starting from first transformed data stored at a position in the dictionary buffer indicated by the output pointer and first transformed data before the first transformed data stored at the position in the dictionary buffer;

an acquisition unit configured to compare a data string including the second substring and second transformed data before the second substring with the selected dictionary data, and acquire at least one first match length indicating a match length between the second substring and the selected dictionary data and at least one second match length indicating a match length between a third substring including continuous second transformed data and the selected dictionary data, the third substring including the second transformed data before the second transformed data at a head of the second substring as a head; and a coded data generator configured to generate coded data for the second input data based on the acquired first and second match lengths, wherein the second transformed data is written to the dictionary buffer.

11. The dictionary compression device according to claim 10, wherein the search unit is configured to output a pointer indicating a position of the first transformed data including the first hash value in the dictionary buffer when the number of the first hash values matching the consecutive second hash values is at least a shortest match length −1, and the shortest match length is a minimum value of a first match length and a second match length acquired by the acquisition unit.

12. The dictionary compression device according to claim 10, further comprising a match length selector configured to select a first match length indicating a longest match length from a plurality of first match lengths when the first match lengths indicating a match length between the second substring and the selected dictionary data are acquired, and select a second match length indicating a longest match length from a plurality of second match lengths when the second match lengths indicating a match length between the third substring and the selected dictionary data are acquired, wherein the coded data generator is configured to generate the coded data based on the selected first and second match lengths.

13. The dictionary compression device according to claim 10, wherein the acquisition unit is configured to acquire a second match length indicating a predetermined longest match length when a match length between the data string and the selected dictionary data exceeds the predetermined longest match length.

14. The dictionary compression device according to claim 10, further comprising an inverse transformer configured to transform a hash value included in the second transformed data into the data using second complementary data included in the second transformed data stored in the dictionary buffer, wherein the coded data generator is configured to generate the coded data based on the transformed data.

15. A memory system comprising:

a nonvolatile memory; and a controller configured to control the nonvolatile memory, the controller including a dictionary compression device configured to compress uncompressed data including first input data and second input data by performing dictionary coding on the second input data subsequent to the first input data after performing dictionary coding on the first input data including a plurality of pieces of consecutive data, wherein the dictionary compression device includes:

a dictionary buffer including a plurality of storage areas and configured to store dictionary data in a dictionary address of a storage area of the plurality of storage areas, each of the plurality of storage areas corresponding to each of a plurality of first substrings, each of the plurality of first substrings including consecutive data, each of the plurality of first substrings including each of a plurality of pieces of data included in the first input data as a head, the dictionary data including a first substring and data before the first substring included in the first input data, the storage area corresponding to the first substring, the dictionary address corresponding to a hash value transformed from the first substrings;

a substring generator configured to generate, from the second input data, a plurality of second substrings, each of the plurality of second substrings including consecutive data, each of the plurality of second substrings including each of a plurality of pieces of data included in the second input data as a head;

a transformer configured to transform each of the second substrings into a hash value;

a read processor configured to read the dictionary data from a plurality of storage areas included in the dictionary buffer, using a hash value transformed from a third substring among the second substrings as a dictionary address;

an acquisition unit configured to compare a data string including the third substring and data before the third substring included in the second input data with the read dictionary data, and acquire at least one first match length indicating a match length between the third substring and the read dictionary data and at least one second match length indicating a match length between a fourth substring including consecutive data having data before data at a head of the third substring as a head and the read dictionary data; and a coded data generator configured to generate coded data for the second input data based on the acquired first and second match lengths, wherein dictionary data including the second substring and data before the second substring included in the second input data is written in a storage area corresponding to the second substring, with a hash value that is transformed from the second substring as a dictionary address, and the controller is configured to write data based on the coded data to the nonvolatile memory.

16. A memory system comprising:
a nonvolatile memory; and
a controller configured to control the nonvolatile memory, the controller including a dictionary compression device configured to compress uncompressed data including first input data and second input data by performing dictionary coding on the second input data subsequent to the first input data after performing dictionary coding on the first input data including a plurality of pieces of consecutive data, wherein the dictionary compression device includes:
a dictionary buffer configured to store the first input data;
a hash table configured to store a dictionary address in which the first substring is stored, using, as a table address, a hash value transformed from each of a plurality of first substrings including consecutive data, each of the plurality of first substrings including each of a plurality of pieces of data included in the first input data as a head;

a substring generator configured to generate, from the second input data, a plurality of second substrings including consecutive data, each of the plurality of second substrings including each of a plurality of pieces of data included in the second input data as a head;

a transformer configured to transform each of the second substrings into a hash value;

a first read processor configured to read the dictionary address from the hash table using a hash value transformed from a third substring among the second substrings as a table address;

a second read processor configured to read, from the dictionary buffer, dictionary data including a first substring stored in the dictionary address and data before the first substring included in the first input data based on the read dictionary address;

an acquisition unit configured to compare a data string including the third substring and data before the third substring included in the second input data with the read dictionary data, and acquire at least one first match length indicating a match length between the third substring and the read dictionary data and at least one second match length indicating a match length between a fourth substring including consecutive data having data before data at a head of the third substring as a head and the read dictionary data; and a coded data generator configured to generate coded data for the second input data based on the acquired first and second match lengths, wherein the second input data is written to the dictionary buffer, a dictionary address in which the second substring is written is written in the hash table using a hash value transformed from the second substring as a table address, and the controller is configured to write data based on the coded data to the nonvolatile memory.

17. A memory system comprising:
a nonvolatile memory; and
a controller configured to control the nonvolatile memory, the controller including a dictionary compression device configured to compress uncompressed data including first input data and second input data by performing dictionary coding on the second input data subsequent to the first input data after performing dictionary coding on the first input data including a plurality of pieces of consecutive data, wherein the dictionary compression device includes:
a dictionary buffer configured to store, for each piece of data, first transformed data including a first hash value transformed from each of a plurality of pieces of data included in the first input data and first complementary data used to inversely transform the first hash value into the data;

a transformer configured to transform each of a plurality of pieces of data included in the second input data into second transformed data including a second hash value and second complementary data used to inversely transform the second hash value into the data;

a substring generator configured to generate a plurality of first substrings from a plurality of consecutive pieces of second transformed data transformed from each of a plurality of pieces of data included in the second input data, the first substrings including the consecutive pieces of second transformed data having each of the pieces of second transformed data as a head;

a search unit configured to search for a second hash value included in consecutive second transformed data included in a second substring among the first substrings from first hash values included in the first transformed data stored in the dictionary buffer, and output a pointer indicating a position of the first transformed data including the first hash value in the dictionary buffer when there is a first hash value matching the consecutive second hash value;

a selector configured to select, from the dictionary buffer, dictionary data including consecutive first transformed data starting from first transformed data stored at a position in the dictionary buffer indicated by the output pointer and first transformed data before the first transformed data stored at the position in the dictionary buffer;

an acquisition unit configured to compare a data string including the second substring and second transformed data before the second substring with the selected dictionary data, and acquire at least one first match length indicating a match length between the second substring and the selected dictionary data and at least one second match length indicating a match length between a third substring including continuous second transformed data and the selected dictionary data, the third substring including the second transformed data before the second transformed data at a head of the second substring as a head; and a coded data generator configured to generate coded data for the second input data based on the acquired first and second match lengths, wherein the second transformed data is written to the dictionary buffer, and the controller is configured to write data based on the coded data to the nonvolatile memory.

\* \* \* \* \*